(12) United States Patent
Robb et al.

(10) Patent No.: US 7,327,142 B2
(45) Date of Patent: Feb. 5, 2008

(54) OPEN PERIPHERAL VASCULAR COIL AND METHOD OF PROVIDING PERIPHERAL VASCULAR IMAGING

(75) Inventors: Fraser J. L. Robb, Aurora, OH (US); Yiping Guan, Aurora, OH (US); Scott Masiella, Silver Lake, OH (US); Janine C. Robb, Aurora, OH (US); Sunyu Su, Hudson, OH (US); Suren Zhao, Aurora, OH (US); Mark Xueming Zou, Aurora, OH (US)

(73) Assignee: General Electric Company, Schenectady, NY (US)

( * ) Notice: Subject to any disclaimer, the term of this patent is extended or adjusted under 35 U.S.C. 154(b) by 22 days.

(21) Appl. No.: 10/878,275

(22) Filed: Jun. 28, 2004

(65) Prior Publication Data

US 2005/0030022 A1    Feb. 10, 2005

Related U.S. Application Data

(60) Provisional application No. 60/483,731, filed on Jun. 30, 2003.

(51) Int. Cl.
    *G01V 3/00*    (2006.01)
(52) U.S. Cl. .................................... 324/318
(58) Field of Classification Search ........ 324/300–322; 600/410–435; 333/219–235; 343/725–730, 343/824, 872–873, 904–906
See application file for complete search history.

(56) References Cited

U.S. PATENT DOCUMENTS

| | | | | |
|---|---|---|---|---|
| 5,166,618 A | * | 11/1992 | Jones et al. ................. | 324/318 |
| 5,280,248 A | * | 1/1994 | Zou et al. ................... | 324/318 |
| 5,361,764 A | * | 11/1994 | Reynolds et al. ........... | 600/422 |
| 5,578,925 A | * | 11/1996 | Molyneaux et al. ........ | 324/318 |
| 5,757,189 A | * | 5/1998 | Molyneaux et al. ........ | 324/318 |
| 6,011,393 A | * | 1/2000 | Kaufman et al. ........... | 324/318 |
| 6,137,291 A | * | 10/2000 | Szumowski et al. ........ | 324/318 |
| 6,169,400 B1 | * | 1/2001 | Sakuma ...................... | 324/318 |
| 6,300,761 B1 | * | 10/2001 | Hagen et al. ............... | 324/318 |
| 6,438,402 B1 | * | 8/2002 | Hashoian et al. ........... | 600/410 |
| 6,441,615 B1 | * | 8/2002 | Fujita et al. ................ | 324/318 |
| 6,493,572 B1 | * | 12/2002 | Su et al. ..................... | 600/422 |
| 6,498,489 B1 | * | 12/2002 | Vij ............................. | 324/322 |

(Continued)

FOREIGN PATENT DOCUMENTS

EP    1 221 623 A2    7/2002

(Continued)

OTHER PUBLICATIONS

International Search Report, dated Aug. 12, 2004, International Appln. No. PCT/US2004/020653, 6 pgs.

*Primary Examiner*—Brij Shrivastav
*Assistant Examiner*—Dixomara Vargas
(74) *Attorney, Agent, or Firm*—The Small Patent Law Group; Dean D. Small

(57) ABSTRACT

An open peripheral vascular coil and method of providing peripheral vascular imaging are provided. The peripheral vascular coil includes a base coil section having a plurality of coil elements and a plurality of coil sections configured for removable attachment to the base coil section. Each of the plurality of coil sections includes a plurality of coil elements.

20 Claims, 34 Drawing Sheets

U.S. PATENT DOCUMENTS

| | | | |
|---|---|---|---|
| 6,504,369 B1 * | 1/2003 | Varjo et al. | 324/318 |
| 6,577,888 B1 * | 6/2003 | Chan et al. | 600/422 |
| 6,624,633 B1 * | 9/2003 | Zou et al. | 324/318 |
| 6,747,454 B2 * | 6/2004 | Belt | 324/318 |
| 6,750,653 B1 * | 6/2004 | Zou et al. | 324/318 |
| 6,784,665 B1 * | 8/2004 | Chan et al. | 324/318 |
| 6,788,056 B2 * | 9/2004 | Vaughan et al. | 324/318 |
| 6,798,202 B2 * | 9/2004 | Savelainen | 324/318 |
| 6,930,481 B2 * | 8/2005 | Okamoto et al. | 324/318 |
| 7,046,008 B2 * | 5/2006 | Okamoto et al. | 324/322 |
| 2003/0057944 A1 | 3/2003 | Van Helvoort et al. | |
| 2003/0062897 A1 | 4/2003 | Belt et al. | |

FOREIGN PATENT DOCUMENTS

| | | |
|---|---|---|
| WO | WO 02/39135 A2 | 5/2002 |

\* cited by examiner (B) ANTERIOR SADDLE COIL (C) POSTERIOR SADDLE COIL (D) ANTI_TURN SOLENOID (E) TWO TURN SOLENOID

(B) ANTERIOR SADDLE COIL

(C) POSTERIOR SADDLE COIL

(D) ANTI_TURN
SOLENOID COIL (E) TWO TURN
SOLENOID

(B) ANTERIOR SADDLE COIL

(C) POSTERIOR SADDLE COIL

(D) ANTI_TURN SOLENOID COIL (E) TWO TURN SOLENOID (B) ANTERIOR SADDLE COIL (C) POSTERIOR SADDLE COIL (D) TWO TURN SOLENOID COIL

OPEN PERIPHERAL VASCULAR COIL AND METHOD OF PROVIDING PERIPHERAL VASCULAR IMAGING

CROSS REFERENCE TO RELATED APPLICATIONS

This application claims priority to and the benefit of the filing date of U.S. Provisional Application No. 60/483,731, filed on Jun. 30, 2003 and which is hereby incorporated by reference in its entirety.

BACKGROUND OF THE INVENTION

This invention relates generally to Magnetic Resonance Imaging (MRI) systems, and more particularly, to Radio-Frequency (RF) coils in such MRI systems.

Magnetic Resonance Imaging (MRI) or Nuclear Magnetic Resonance (NMR) imaging generally provides for the spatial discrimination of resonant interactions between RF waves and nuclei in a magnetic field. Specifically, MRI utilizes hydrogen nuclear spins of the water molecules in the human body, which are polarized by a strong, uniform, static magnetic field of a magnet. This magnetic field is commonly referred to as $B_0$ or the main magnetic field. The magnetically polarized nuclear spins generate magnetic moments in the human body. The magnetic moments point in the direction of the main magnetic field in a steady state, but produce no useful information if these magnetic moments are not disturbed by any excitation.

The generation of NMR signals for MRI data acquisition is accomplished by exciting the magnetic moments with a uniform RF magnetic field. This RF magnetic field is commonly referred to as the $B_1$ field or the excitation field. The $B_1$ field is produced in the imaging region of interest by an RF transmit coil that is usually driven by a computer-controlled RF transmitter with a power amplifier. During excitation, the nuclear spin system absorbs magnetic energy and the magnetic moments precess around the direction of the main magnetic field. After excitation, the precessing magnetic moments will go through a process of Free Induction Decay (FID), releasing their absorbed energy and returning to the steady state. During FID, NMR signals are detected by the use of a receive RF coil, which is placed in the vicinity of the excited volume of the human body.

The NMR signal is the secondary electrical voltage (or current) in the receive RF coil that has been induced by the precessing magnetic moments of the human tissue. The receive RF coil can be either the transmit coil operating in a receive mode or an independent receive-only RF coil. The NMR signal is used for producing MR images by using additional pulsed magnetic gradient fields, which are generated by gradient coils integrated inside the main magnet system. The gradient fields are used to spatially encode the signals and selectively excite a specific volume of the human body. There are usually three sets of gradient coils in a standard MRI system that generate magnetic fields in the same direction of the main magnetic field, and varying linearly in the imaging volume.

In MRI, it is desirable for the excitation and reception to be spatially uniform in the imaging volume for better image uniformity. In known MRI systems, the best excitation field homogeneity is usually obtained by using a whole-body volume RF coil for transmission. The whole-body transmit coil is the largest RF coil in the system. A large coil, however, produces lower signal-to-noise ratio (SNR or S/N) if it is also used for reception, mainly because of its greater distance from the signal-generating tissues being imaged. Because a high signal-to-noise ratio is very desirable in MRI, special-purpose coils have been used for reception to enhance the S/N ratio from the volume of interest. In practice, a well-designed specialty or special-purpose RF coil has the following functional properties: high S/N ratio, good uniformity, high unloaded quality factor (Q) of the resonance circuit, and high ratio of the unloaded to loaded Q factors. Additionally, the coil should be mechanically designed to facilitate patient handling and comfort, as well as to provide a protective barrier between the patient and the RF electronics.

In order to reduce MRI data acquisition time, it is known to use faster and more powerful (e.g., greater processing power) gradient hardware. For example, parallel imaging techniques such as sensitivity encoding (SENSE) and simultaneous acquisition of spatial harmonics (SMASH) provide reduction in imaging time by using spatial information inherent in a multiple receiver coil array. In these parallel imaging techniques, multiple phase-encoded data is collected in parallel from a single phase-encoded MR signal. In operation, multiple lines of K-space data are acquired simultaneously using multiple receiver coil systems. Each component coil in an array system is characterized by a unique $B_1$ sensitivity function. Each sensitivity function includes spatial information that may be used in the spatial encoding process. Because this information can be used to reduce the number of gradient based spatial encoding steps, imaging speed is increased.

When individuals suffer from stenotic and occlusive peripheral vascular disease, blockages or blood flow restriction develop in the arterial system. This can lead to strokes or result in amputation. When individuals develop peripheral vascular disease, a radiologist is principally interested in examining the arterial system of the individual from the heart down to the feet.

This peripheral vascular disease was at one time evaluated using X-ray technology with injected contrast agents. As MRI developed as a clinical tool, similar exams for detecting or evaluating peripheral vascular disease were performed using MR contrast agents. This technique is often called "Contrast Enhanced Multi-Station Peripheral Vascular MR Angiography." The term multi-station applies to the procedure of moving the patient through the bore of the system in stages or stations until images from the whole length of the patient have been collected.

The resolution of the resulting images was initially poor due to the use of the large system body coil (e.g., whole-body coil). Because some of the arteries are very small in the lower legs and feet, these arteries can be hard to visualize. To improve the resolution of the MR images, phased arrays have been used. In particular, peripheral vascular (PV) coils have been used in connection with horizontal bore MRI systems. However, the coil arrays are not configured for operation in connection with open PV systems.

In horizontal systems the static magnetic field ($B_0$) is generated in a direction such that it is parallel with the human body, with the subject lying flat. In an open system, the static magnetic field is generated in a direction transverse to the human body lying flat. Open MRI system allow much larger individuals to be imaged, including performing MRI peripheral vascular studies on these larger individuals. However, known open MRI system do not allow for PV exams to be performed. Further, although whole-body coils may be used for PV exams, the resolution of images resulting from such exams is often unacceptable, thereby making, for example, proper diagnosis impossible.

BRIEF DESCRIPTION OF THE INVENTION

In one exemplary embodiment, a peripheral vascular coil is provided that includes a base coil section having a plurality of coil elements and a plurality of coil sections configured for removable attachment to the base coil section. Each of the plurality of coil sections includes a plurality of coil elements.

In another exemplary embodiment, a peripheral vascular coil is provided that includes a plurality of imaging stations formed by (i) a posterior base section, (ii) a plurality of anterior sections and (iii) a foot section. Each of the plurality of anterior sections and the foot section is configured to be removably attached to the posterior base section. The peripheral vascular coil further includes a plurality of coil elements forming the sections and including at least one of uneven counter rotational coil elements, co-rotating two-turn solenoid coil elements and saddle coil elements.

In still another exemplary embodiment, a method for performing peripheral vascular imaging using an open magnetic resonance imaging system is provided. The method includes configuring a plurality of imaging stations such that three of the plurality of imaging stations include two saddle coil elements and two solenoid coil elements and one of the plurality of imaging stations includes two saddle coil elements and one solenoid coil element. The method further includes providing a connection system for removably attaching coil sections to form the plurality of imaging stations.

BRIEF DESCRIPTION OF THE DRAWINGS

FIG. 35 is a partial perspective view a foot section of a PV coil in accordance with an exemplary embodiment of the invention showing connections thereof.

DETAILED DESCRIPTION OF THE INVENTION

Various embodiments of the invention allow peripheral vascular (PV) exams (e.g., PV imaging) to be performed using an open MRI system. More particularly, the coil arrangements of various embodiments of the invention provide imaging of vasculature and soft tissue anatomy extending from the torso to the foot region using an open MRI system. Thus, MR images may be obtained using, for example, SENSE imaging in connection with the coil arrangements of various embodiments of the invention.

Figure 1:
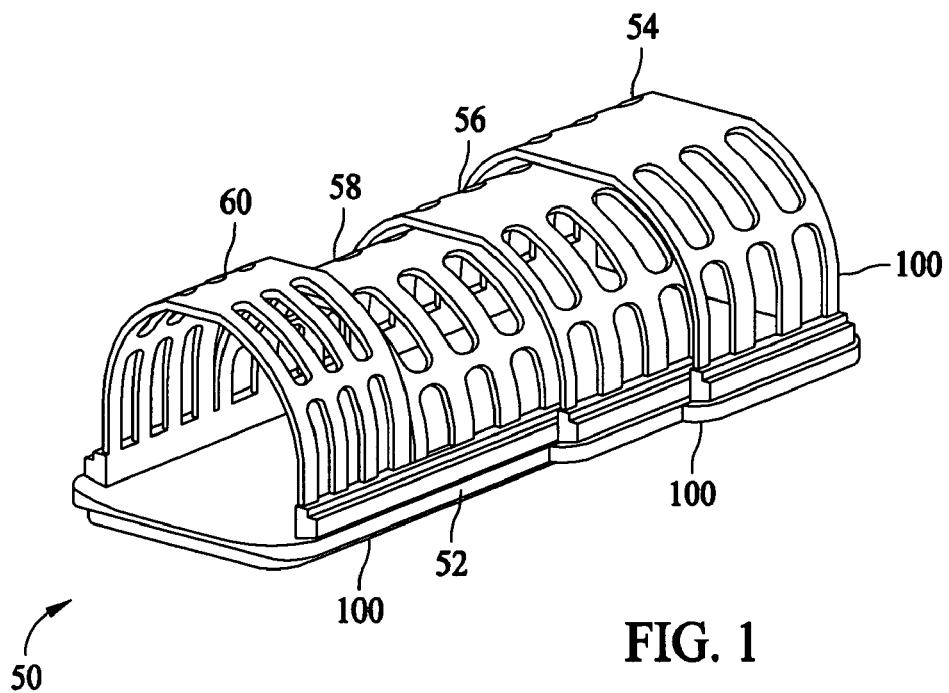
FIG. 1 is a perspective view of a peripheral vascular (PV) coil in accordance with an exemplary embodiment of the invention.

In general, and as shown in FIG. 1, various embodiments of the invention provide a PV coil 50 having a main coil base 52, a first top coil section 54, a second top coil section 56, a third top coil section 58 and a foot section 60. As described in more detail herein, the top sections 52, 54 and 56, and foot coil section 60 are removably connectable to the main coil base 52, using, for example, using a connection system (e.g., a latching system) to provide mechanical connection and electrical contact pins to provide electrical connection. In one exemplary embodiment, the main coil base 52 is configured as a posterior section and the first top coil section 54, the second top coil section 56, the third top coil section 58 and the foot coil section 60 are each configured as anterior sections.

Each section is configured to receive an NMR signal from a patient being examined or imaged within the PV coil 50. Specifically, and in one exemplary embodiment, the first top coil section 54 is configured to image a torso region of the patient, the second top coil section 56 is configured to image the pelvic region of the patient, the third top coil section 58 is configured to image the upper legs of the patient and the foot coil section 60 is configured to image the lower legs and feet of the patient. In one embodiment, the various sections are configured as separate removable stations, and more particularly, imaging or electrical stations.

Figure 2:
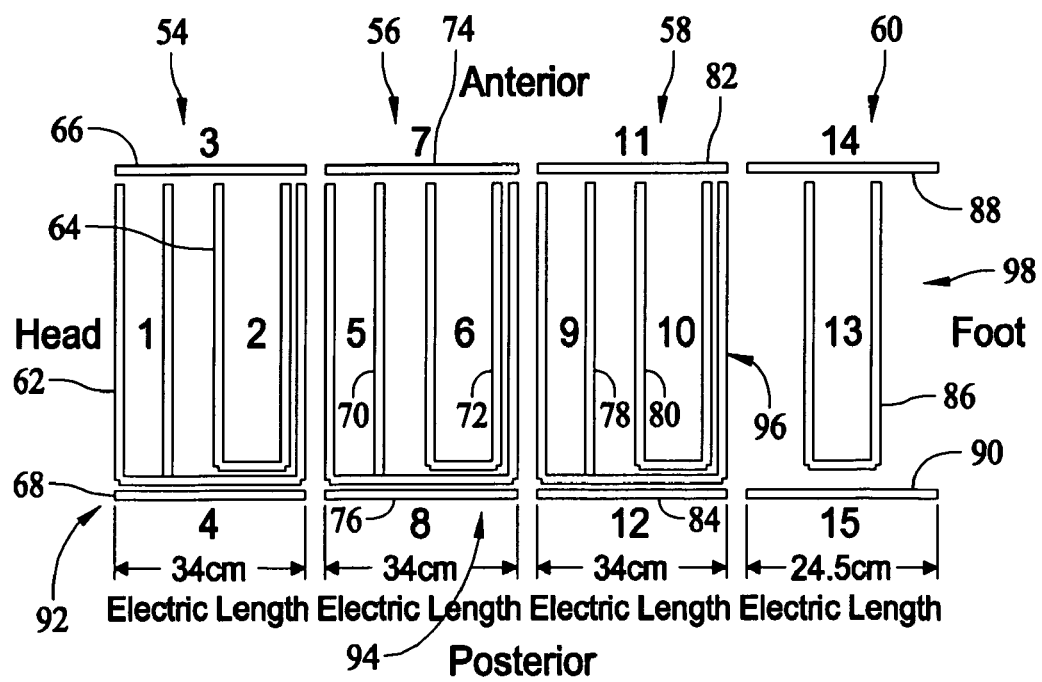
FIG. 2 is a schematic diagram showing coil elements of the PV coil of FIG. 1.

The electrical configuration of one embodiment of the PV coil 50 is shown in FIG. 2 having four imaging stations 92, 94, 96 and 98. As shown therein, coil elements 62, 70 and 78 are uneven counter rotational coils (e.g., uneven counter rotational solenoid coils). Coil elements 64, 72, 80 and 86 are co-rotating two-turn solenoid coils. Coil elements 66, 74, 82 and 88 are top saddle coils. Coil elements 68, 76, 84 and 90 are bottom saddle coils. In this embodiment there are four elements (two saddle coils and two solenoid coils) in each of imaging stations 92, 94 and 96, and three elements (two saddle coils and one solenoid coil) in imaging station 98. All of the elements are enclosed in housings, for example rigid plastic housings 100 as shown in FIG. 1. It should be noted that the terms top and anterior and bottom and posterior are used interchangeably herein.

Figure 3:
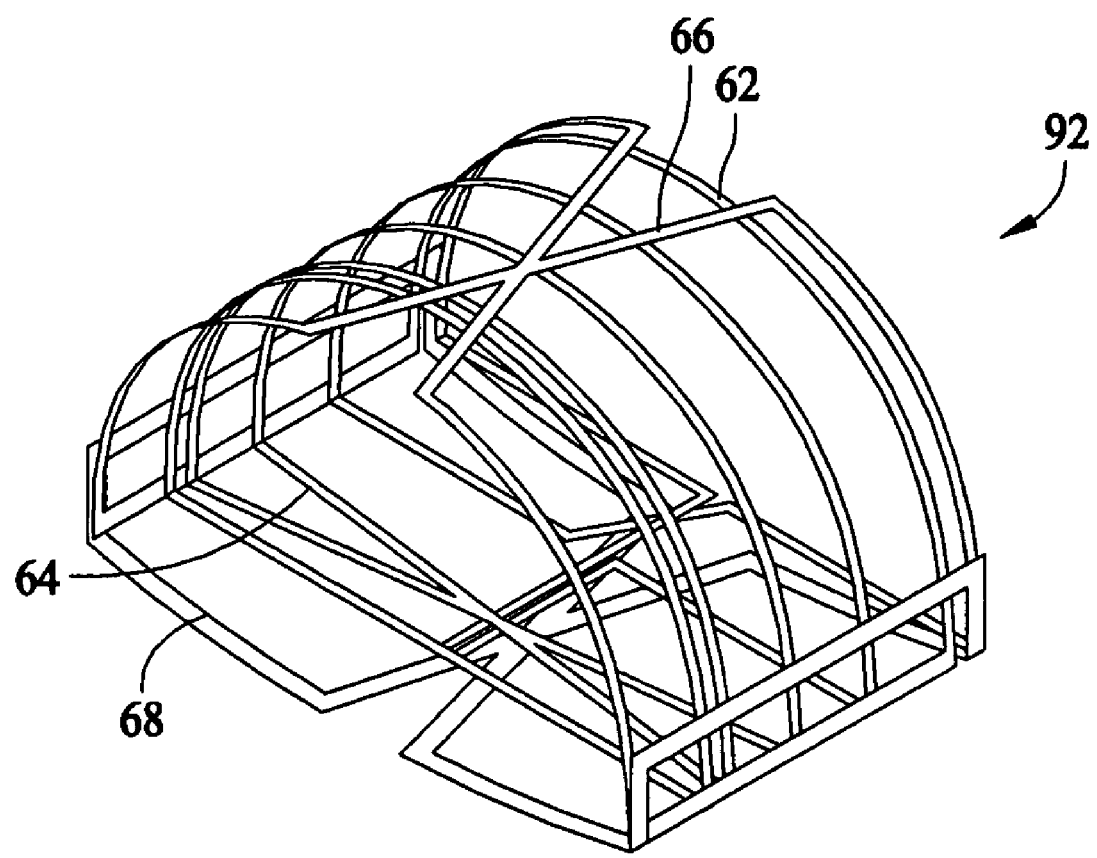
FIG. 3 is a perspective view of coil elements in one station of the PV coil of FIG. 1.
Figure 4:
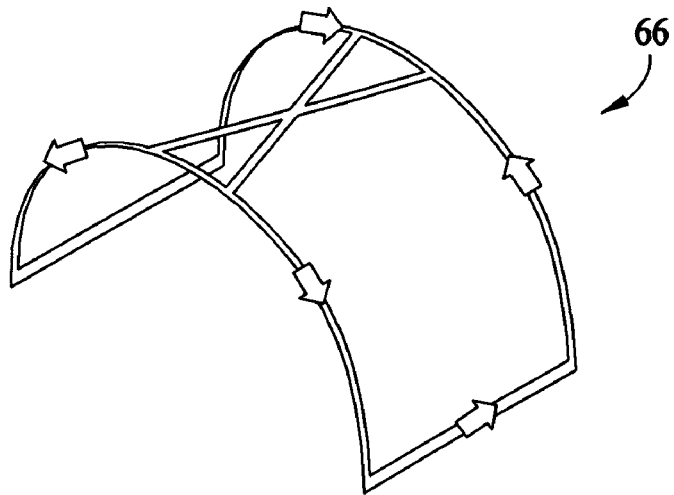
FIG. 4 is a perspective view of one of the coil elements in the station of FIG. 3.
Figure 5:
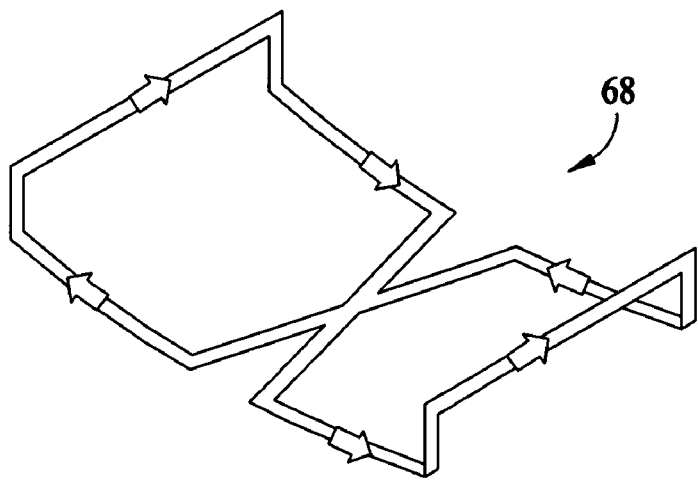
FIG. 5 is a perspective view of another one of the coil elements in the station of FIG. 3.
Figure 6:
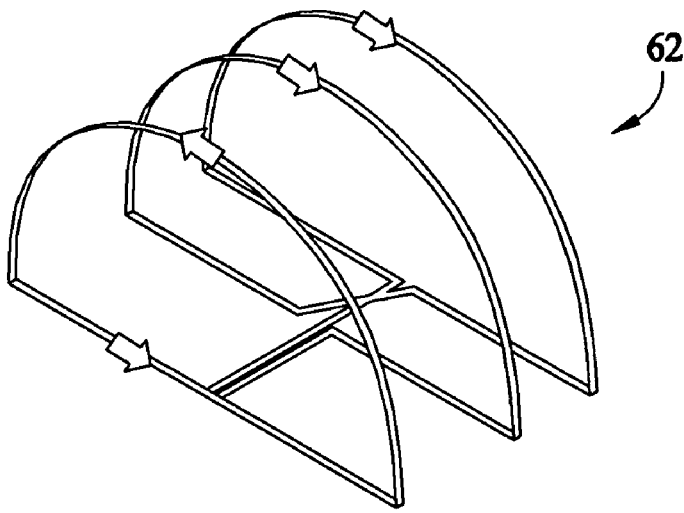
FIG. 6 is a perspective view of another one of the coil elements in the station of FIG. 3.
Figure 7:
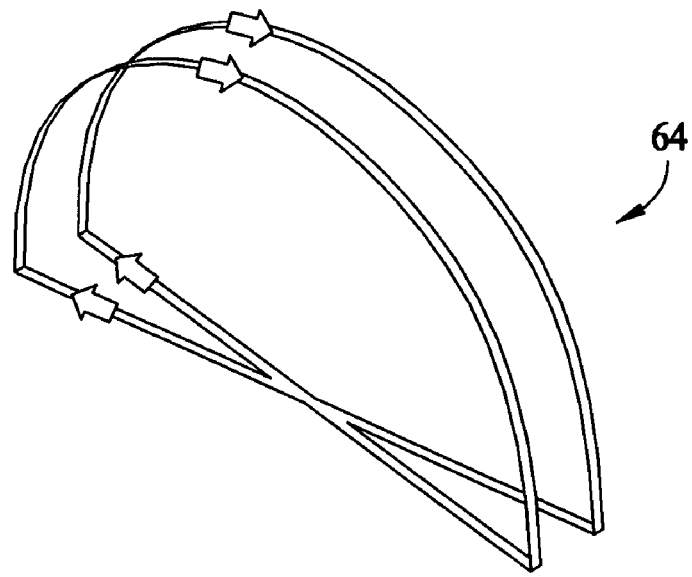
FIG. 7 is a perspective view of another one of the coil elements in the station of FIG. 3.
Figure 8:
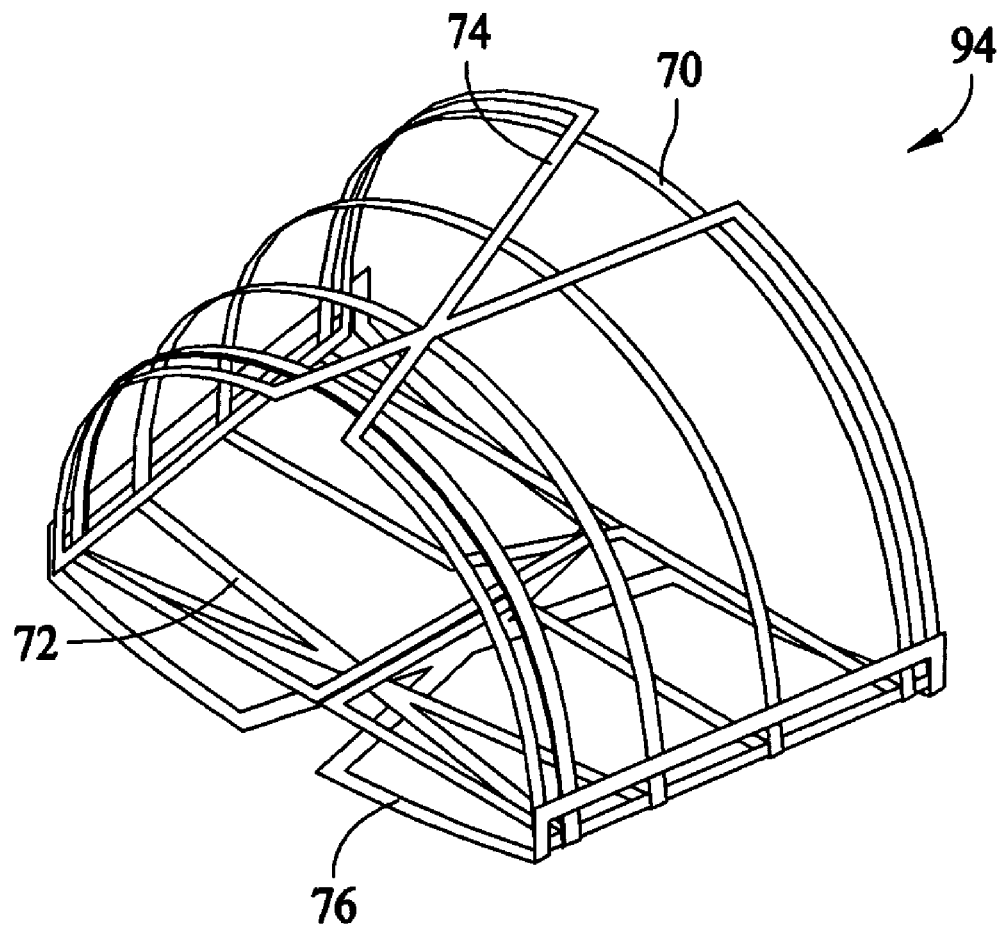
FIG. 8 is a perspective view of coil elements in another station of the PV coil of FIG. 1.
Figure 9:
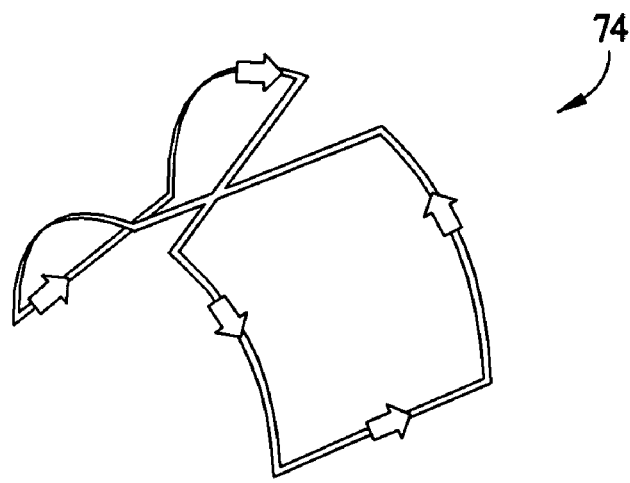
FIG. 9 is a perspective view of one of the coil elements in the station of FIG. 8.
Figure 10:
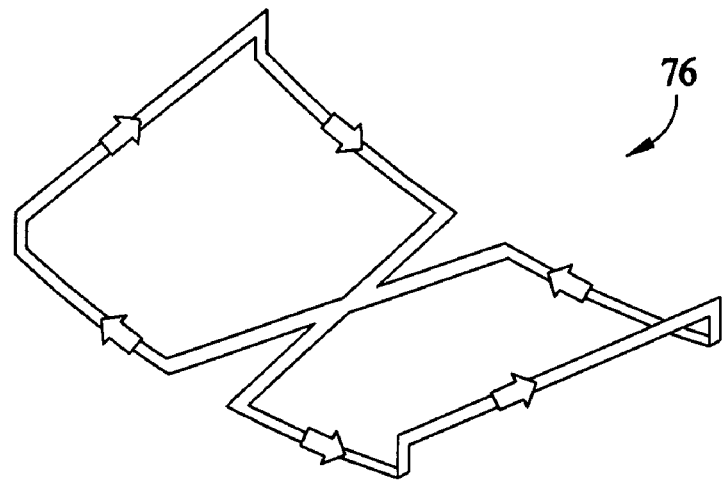
FIG. 10 is a perspective view of another one of the coil elements in the station of FIG. 8.
Figure 11:
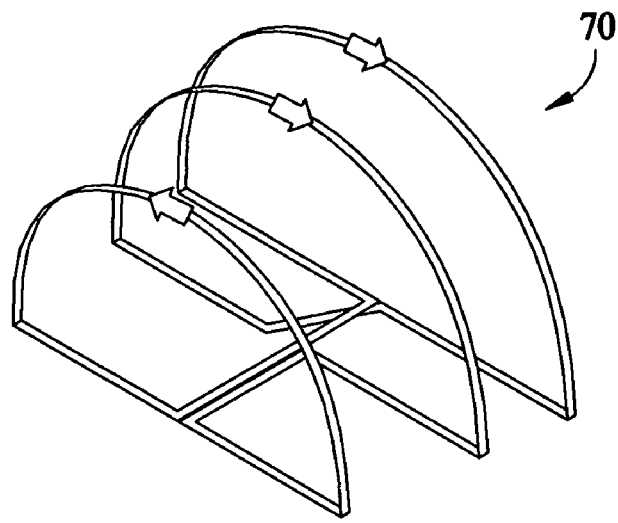
FIG. 11 is a perspective view of another one of the coil elements in the station of FIG. 8.
Figure 12:
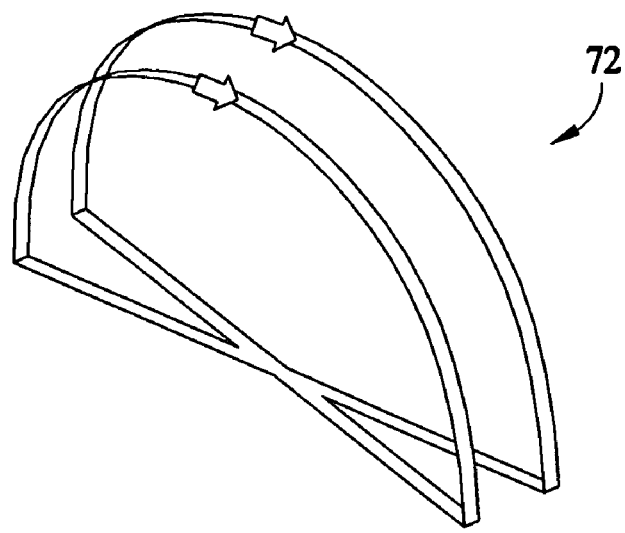
FIG. 12 is a perspective view of another one of the coil elements in the station of FIG. 8.
Figure 13:
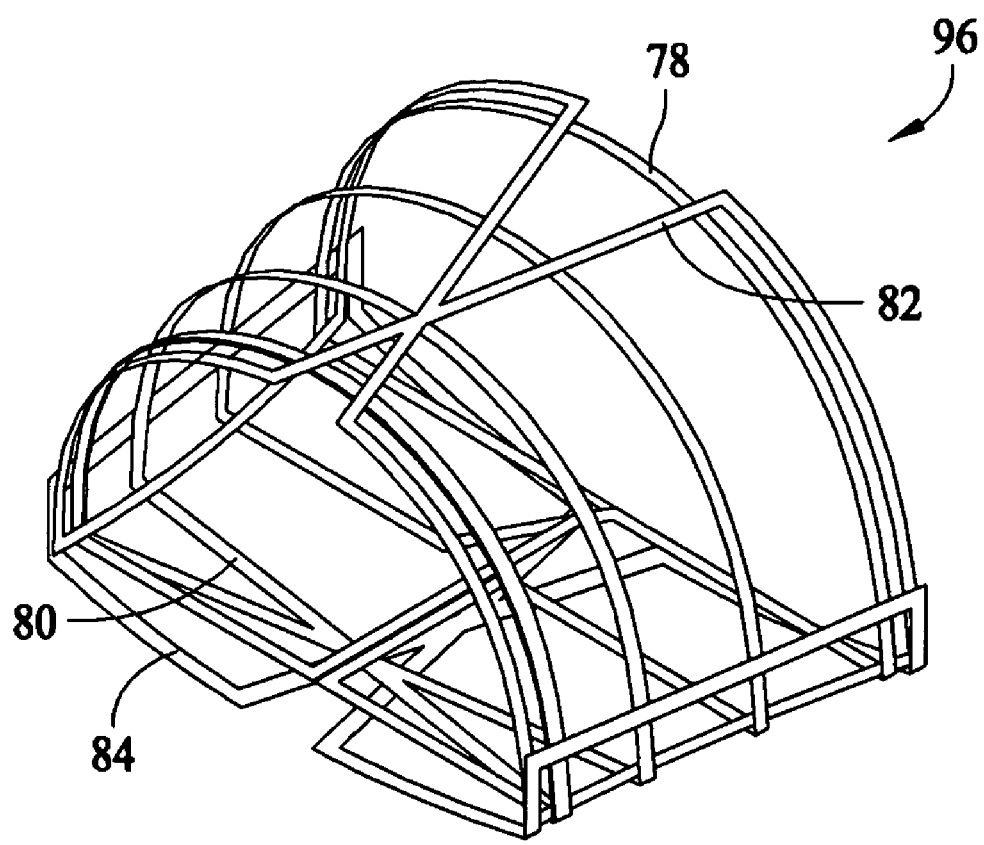
FIG. 13 is a perspective view of coil elements in another station of the PV coil of FIG. 1.
Figure 14:
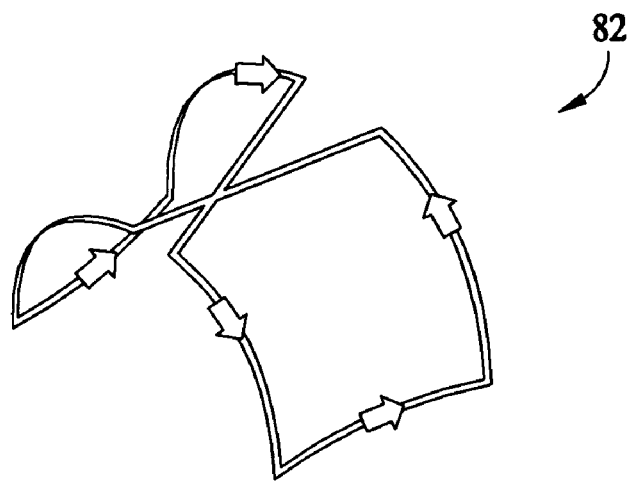
FIG. 14 is a perspective view of one of the coil elements in the station of FIG. 13.
Figure 15:
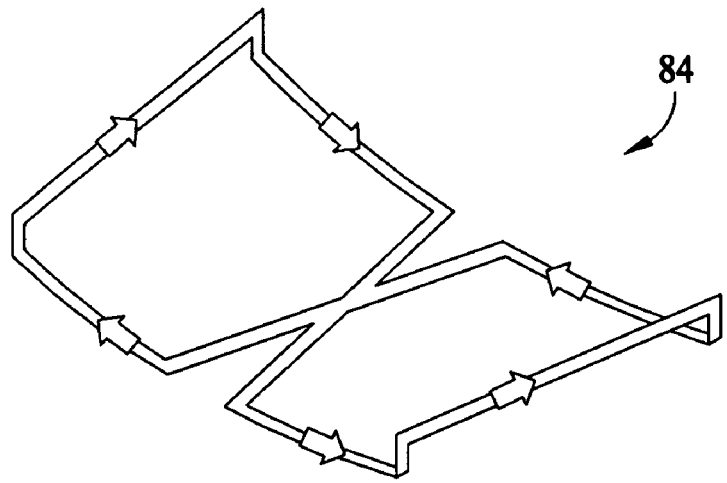
FIG. 15 is a perspective view of another one of the coil elements in the station of FIG. 13.
Figure 16:
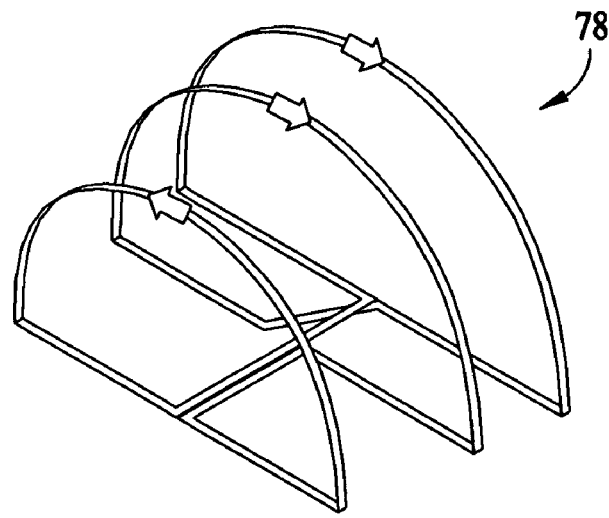
FIG. 16 is a perspective view of another one of the coil elements in the station of FIG. 13.
Figure 17:
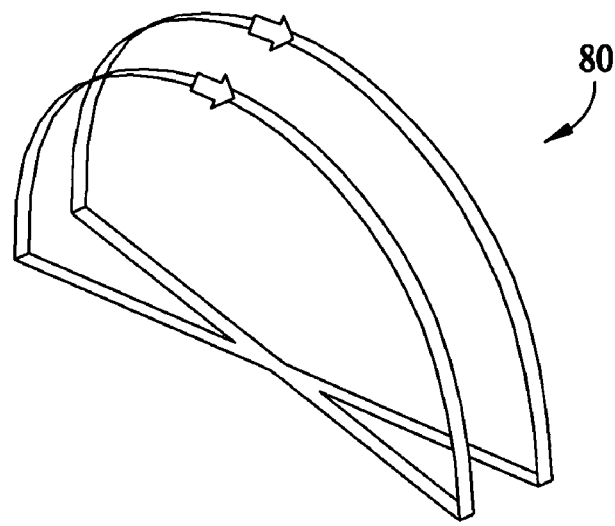
FIG. 17 is a perspective view of another one of the coil elements in the station of FIG. 13.
Figure 18:
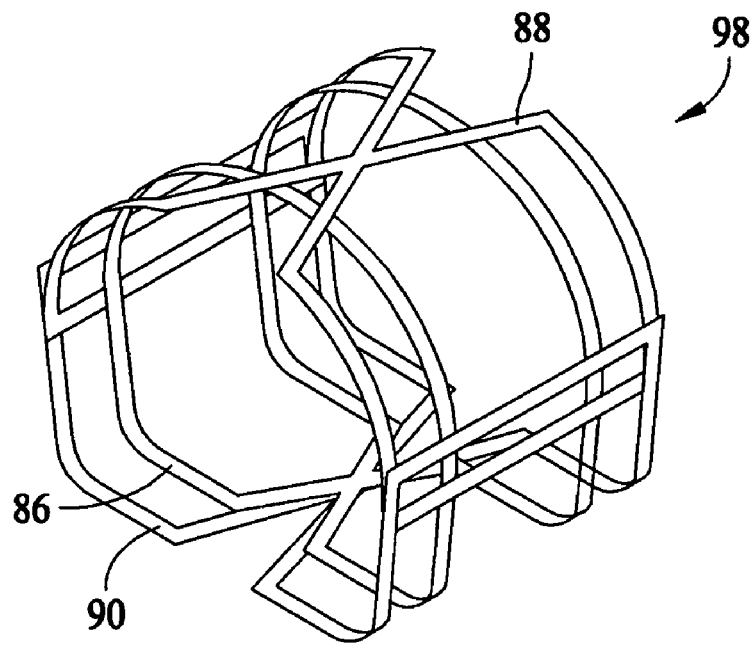
FIG. 18 is a perspective view of coil elements in another station of the PV coil of FIG. 1.
Figure 19:
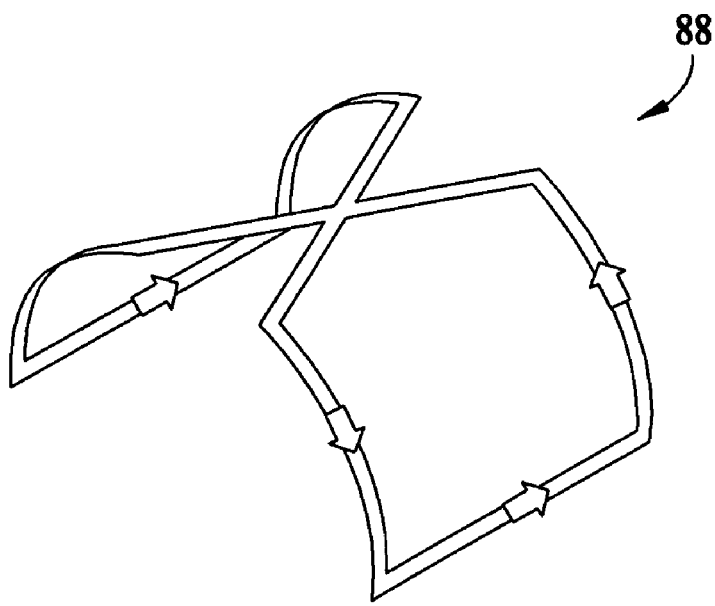
FIG. 19 is a perspective view of one of the coil elements in the station of FIG. 18.
Figure 20:
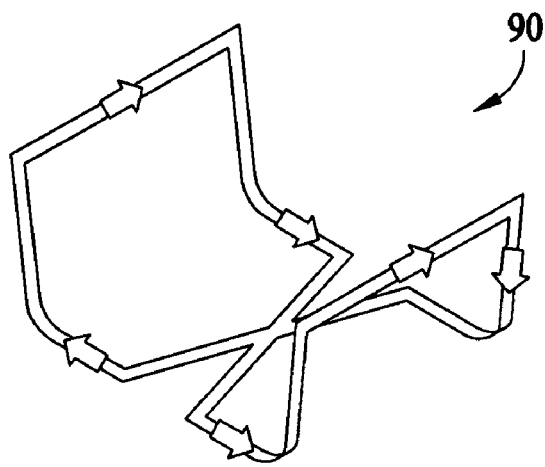
FIG. 20 is a perspective view of another one of the coil elements in the station of FIG. 18.
Figure 21:
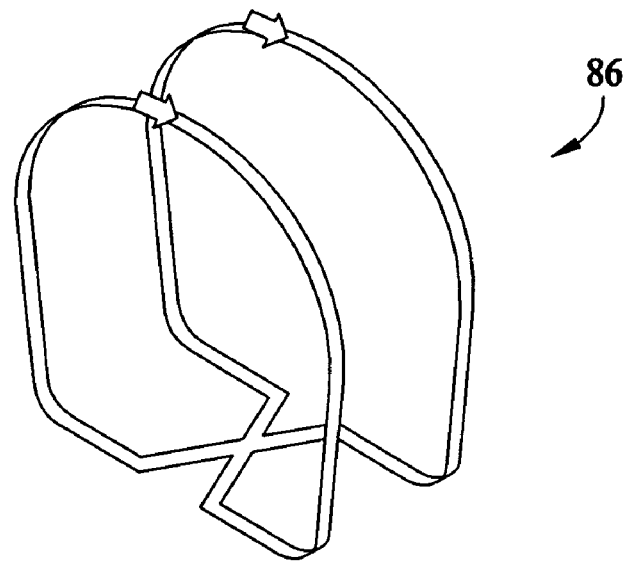
FIG. 21 is a perspective view of another one of the coil elements in the station of FIG. 18.

The various stations will now be described in detail. Specifically, as shown in FIG. 3, station 92, which is configured to image the torso region is formed from four coil elements, and more particularly, coil elements 62, 64, 66 and 68. The coil elements 62, 64, 66 and 68 also are shown separately in FIGS. 4 through 7. As shown in FIG. 8, station 94, which is configured to image the pelvic region is formed from four coil elements, and more particularly, coil elements 70, 72, 74 and 76. The coil elements 70, 72, 74 and 76 also are shown separately in FIGS. 9 through 12. As shown in FIG. 13, station 96, which is configured to image the upper legs is formed from four coil elements, and more particularly, coil elements 78, 80, 82 and 84. The coil elements 78, 80, 82 and 84 also are shown separately in FIGS. 14 through 17. As shown in FIG. 18, station 98, which is configured to image the lower legs and feet is formed from three coil elements, and more particularly, coil elements 86, 88 and 90. The coil elements 86, 88 and 90 also are shown separately in FIGS. 19 through 21.

In this embodiment, the stations are sized and configured to image specific portions of the patient as shown and described herein. All stations include top and bottom saddle coils configured to provide imaging coverage in the middle of the imaging volume. Stations 92, 94 and 96 also include uneven counter rotational and two-turn solenoid coils to provide an uneven counter-rotational (UCR) solenoidal array.

Figure 22:
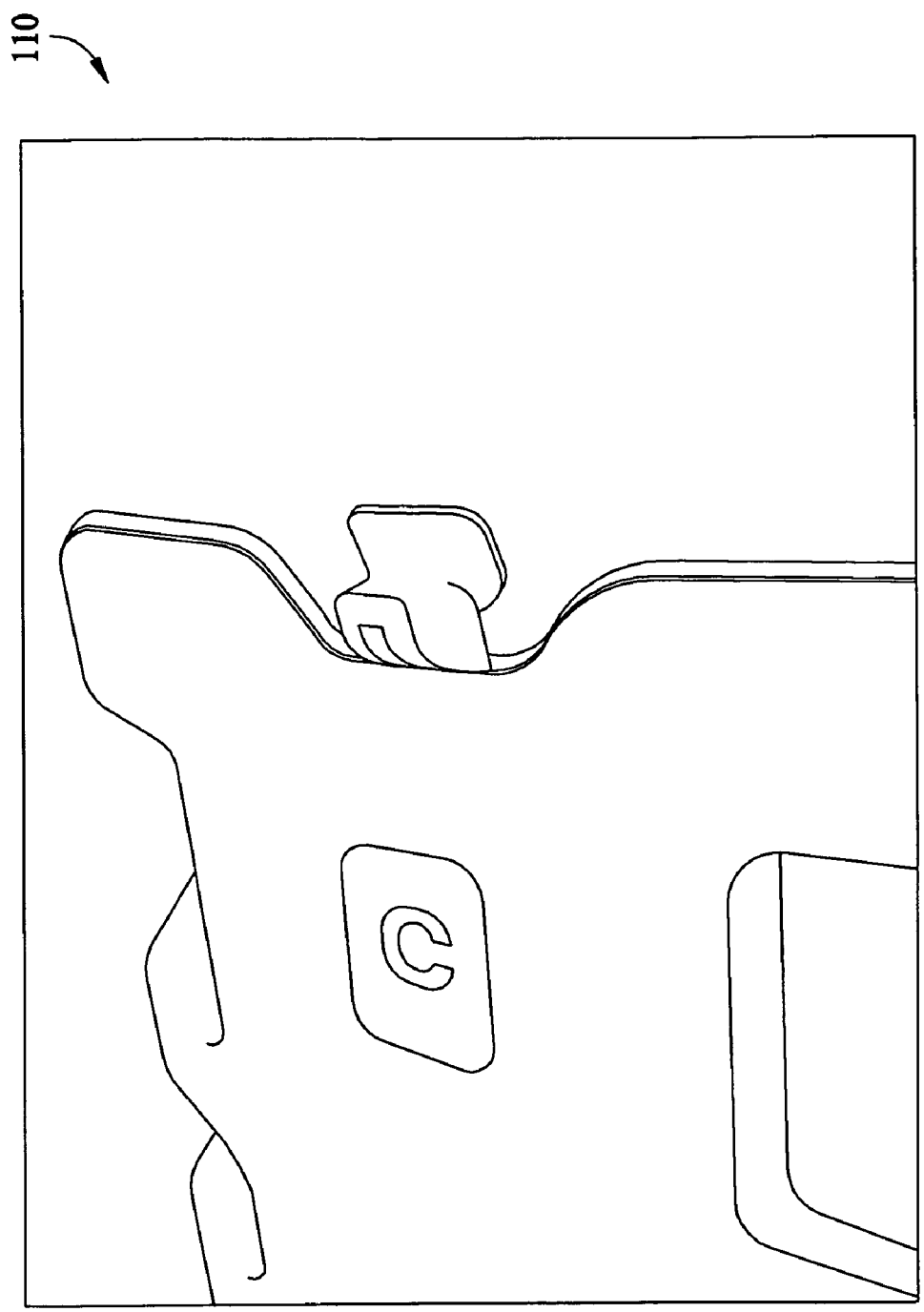
FIG. 22 is a perspective view of a latch of a PV coil in accordance with an exemplary embodiment of the invention.
Figure 23:
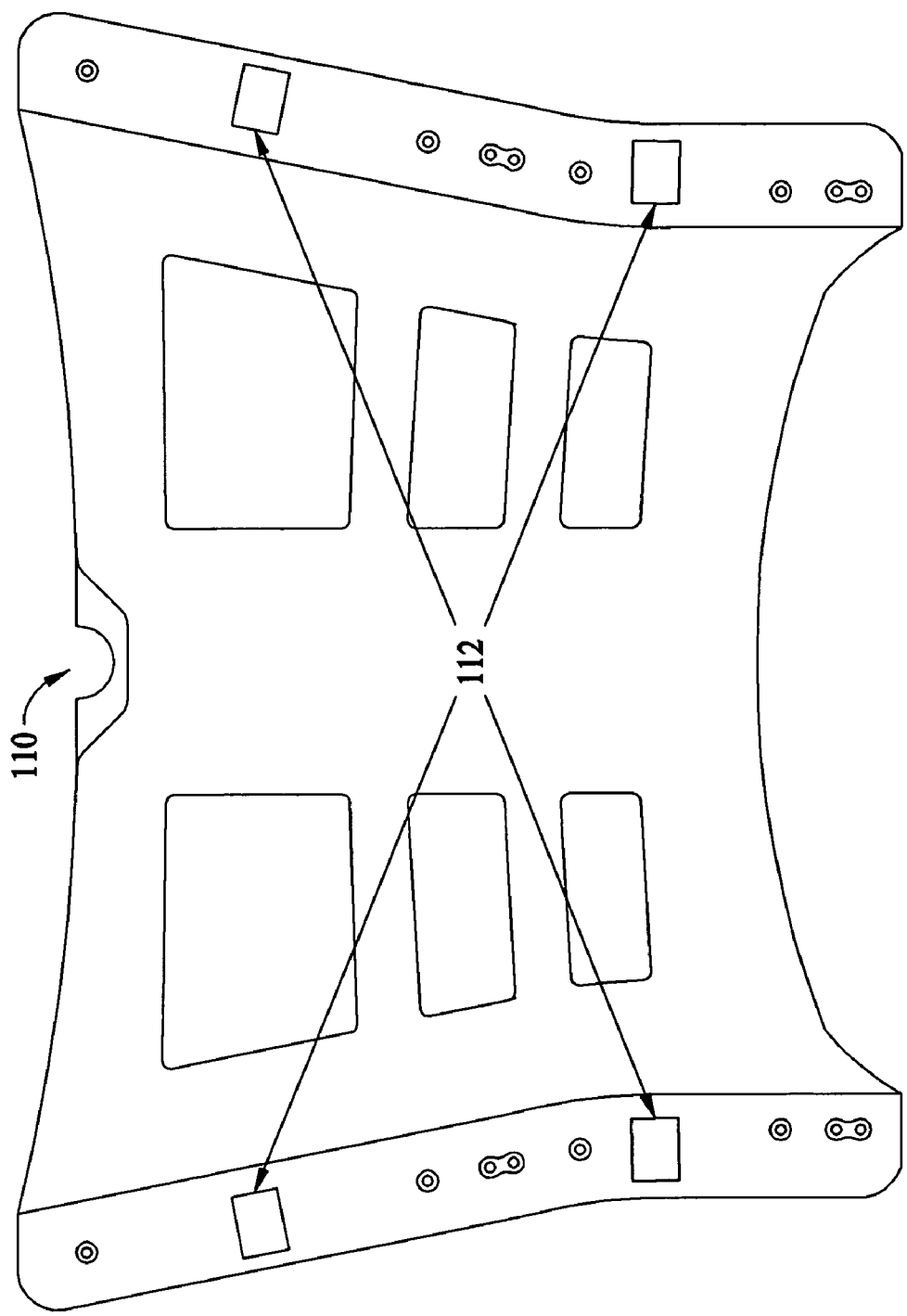
FIG. 23 is a bottom plan view of a coil section of a PV coil in accordance with an exemplary embodiment of the invention.
Figure 24:
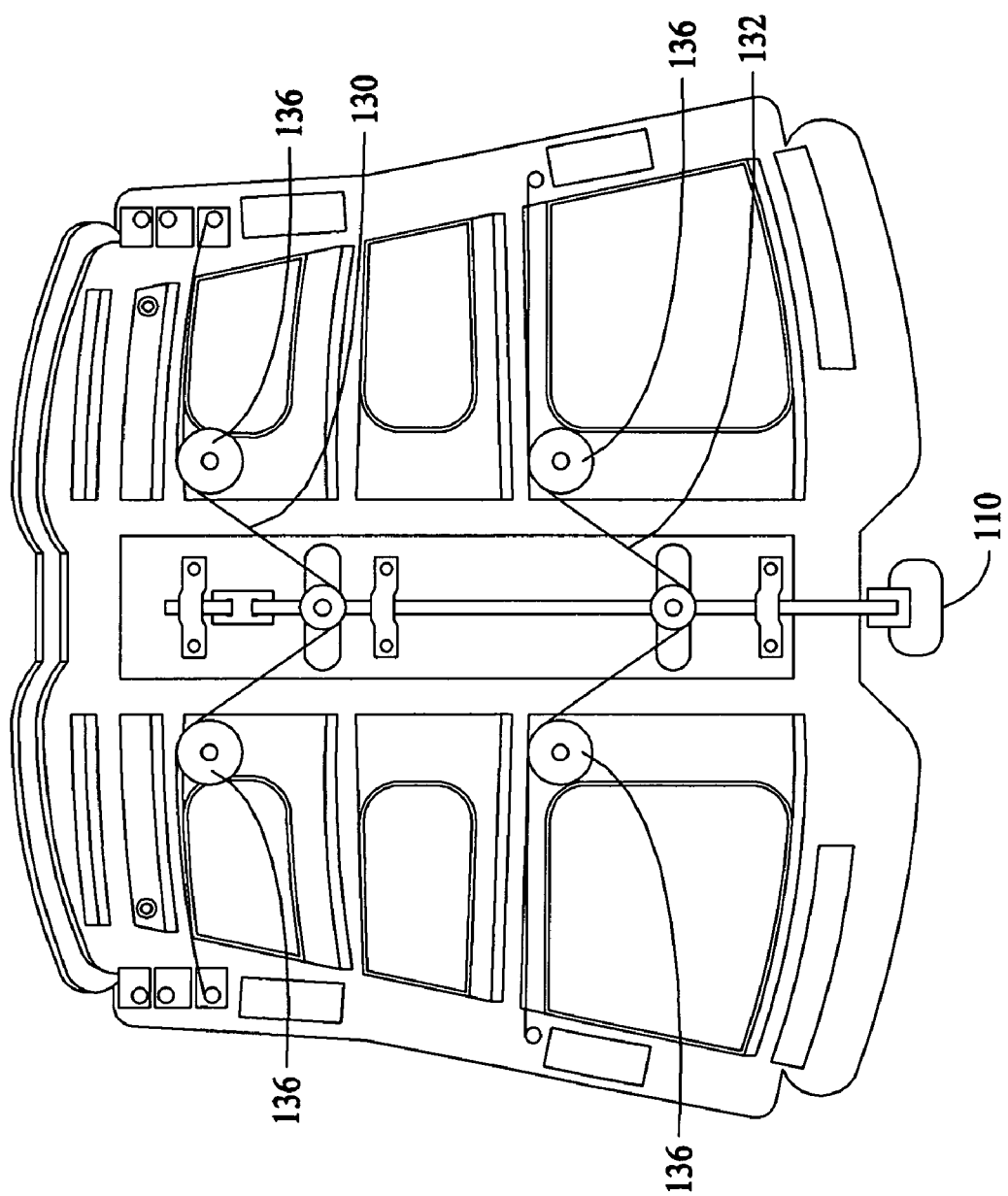
FIG. 24 is a plan view of a connection system of a PV coil in accordance with an exemplary embodiment of the invention.
Figure 25:
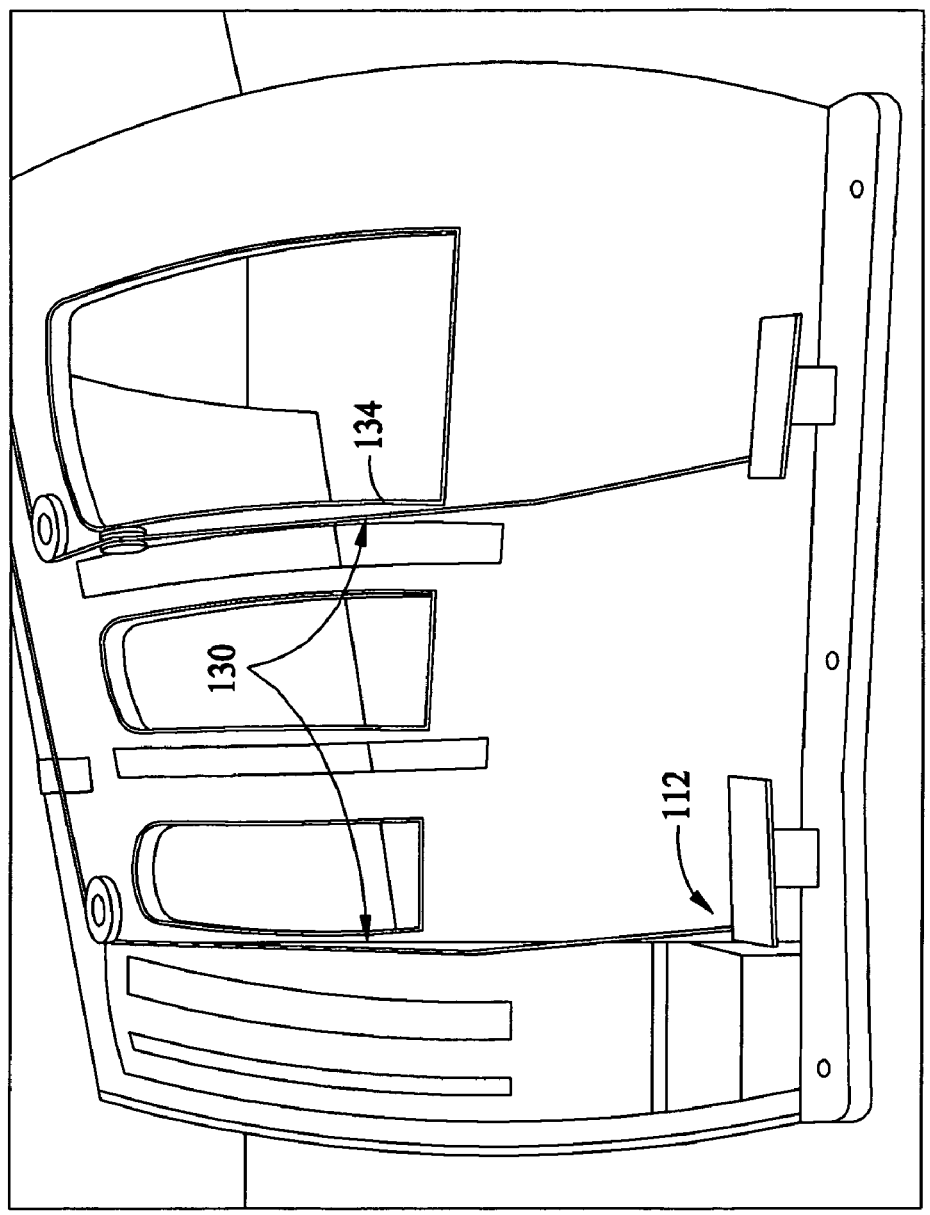
FIG. 25 is a perspective view of a connection system of a PV coil in accordance with an exemplary embodiment of the invention.
Figure 26:
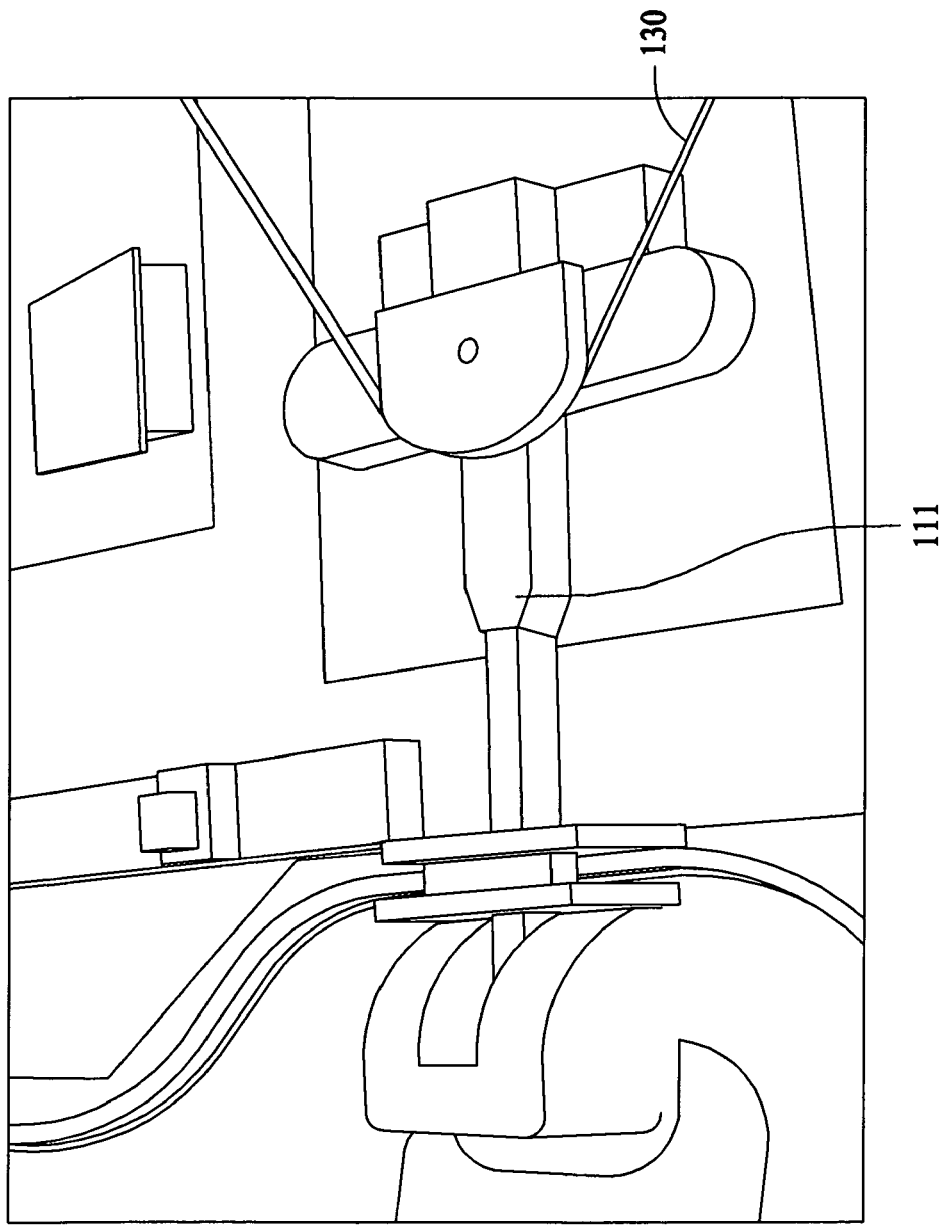
FIG. 26 is a perspective view of a latching mechanism of a connection system of a PV coil in accordance with an exemplary embodiment of the invention.

The PV coil 50 formed from the stations 92, 94, 96 and 98 provide detachable sections. Specifically, and with respect to the top coil sections 54, 56 and 58, which also may be referred to as anterior sections, a mechanical connection system as shown in FIGS. 22 and 23 is provided for mechanically removably connecting the top coil sections 54, 56 and 58 to the main coil base 52. As shown, the mechanical connection system includes a lever 110 having an extension 111 (shown in FIG. 26) for operating latching portions 112 on a bottom of the sections. The latching portions 112, may be, for example, spring loaded connectors. This configuration allows for single finger operation. In operation the lever 110 locks and releases the latching portions 112.

Figure 27:
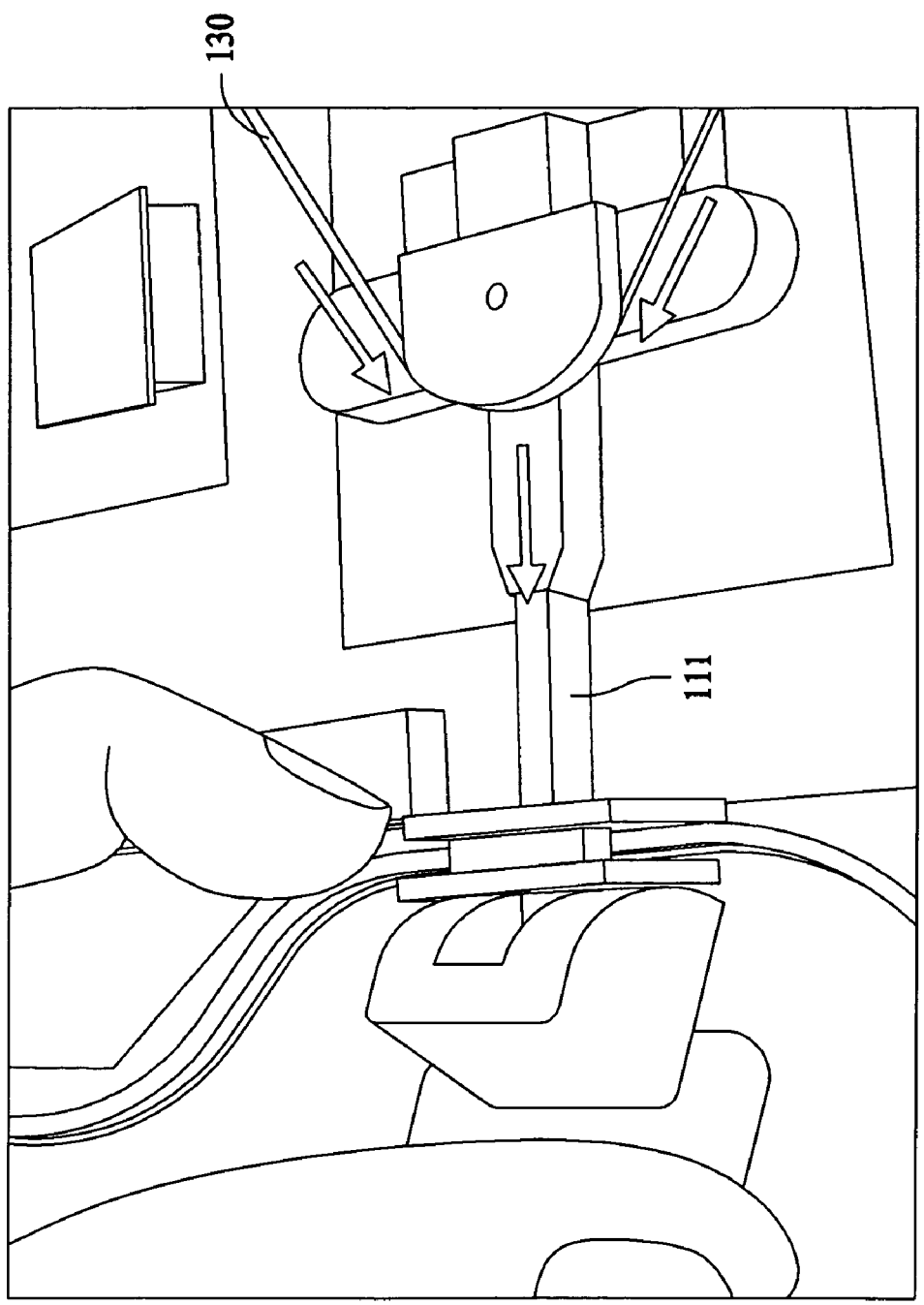
FIG. 27 is another perspective view of a latching mechanism of a connection system of a PV coil in accordance with an exemplary embodiment of the invention.
Figure 28:
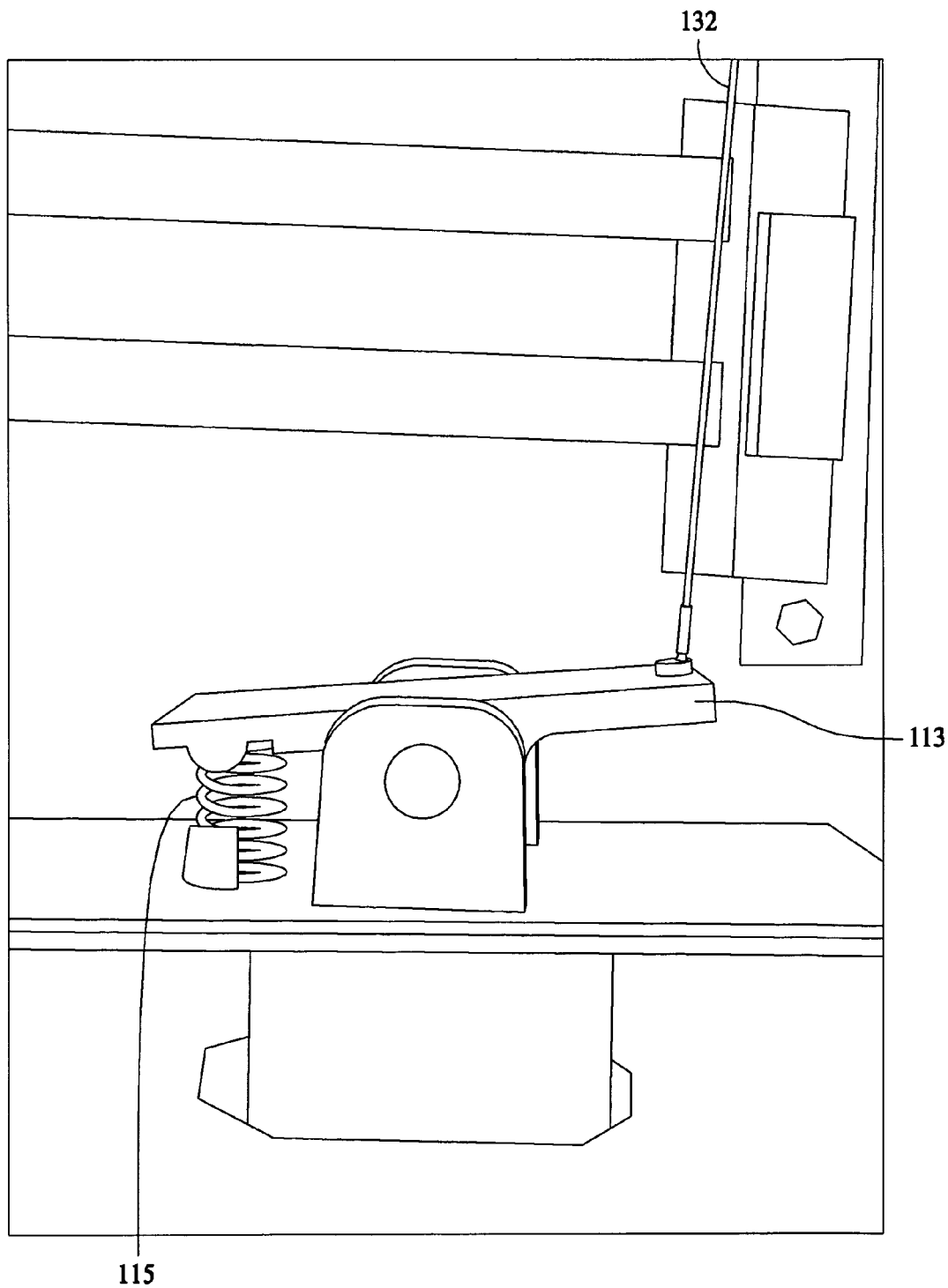
FIG. 28 is another perspective view of a latching mechanism of a connection system of a PV coil in accordance with an exemplary embodiment of the invention.
Figure 29:
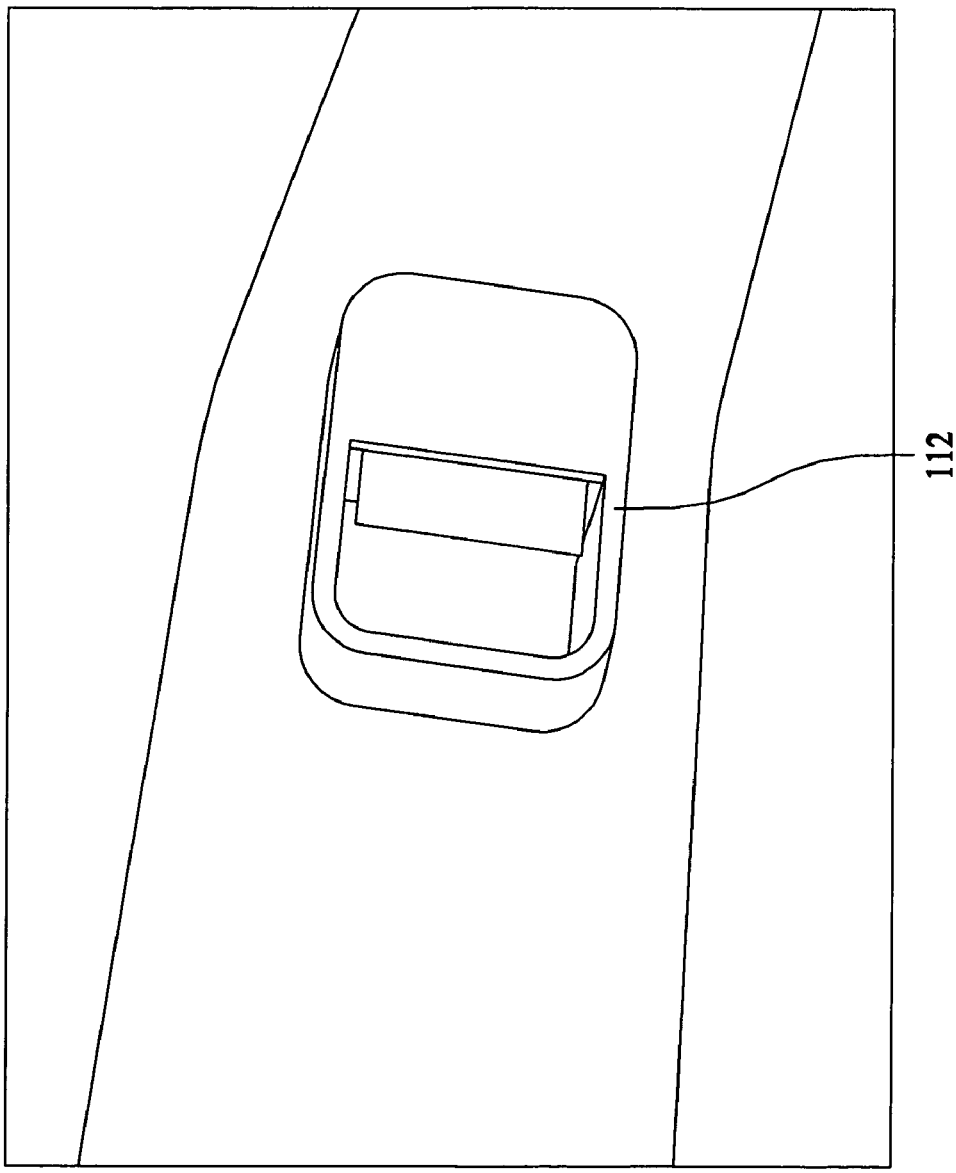
FIG. 29 is a perspective view of a latching portion of a connection system of a PV coil in accordance with an exemplary embodiment of the invention.

In one embodiment, the connection member includes a plurality of cables, for example, two cables 130 and 132 (e.g., cord or string) as shown in FIGS. 24 through 27 that may be independently adjusted for tension requirements, and which may be provided through a channel 134 in the housing 100 (shown in FIG. 1). The mechanical connection system also includes a plurality of pulleys, for example, four pulleys 136. In operation, pulling on the lever 110 pulls on one of the cables 130 or 132, as shown in FIG. 27 by the arrows, which causes a latching mechanism 113 (shown in FIG. 28) that includes a spring 115 to pivot and release a top section 54, 56 or 58 from the latching portions 112 of the main coil base 52. The top sections 54, 56 and 58 spring up when released due to the spring loaded connectors. The latching portion 112 is shown more clearly in FIG. 29.

It should be noted that each of the top sections 54, 56 and 58 may have different numbers and types of the component parts as desired or needed (e.g., based on the size of the section).

Figure 30:
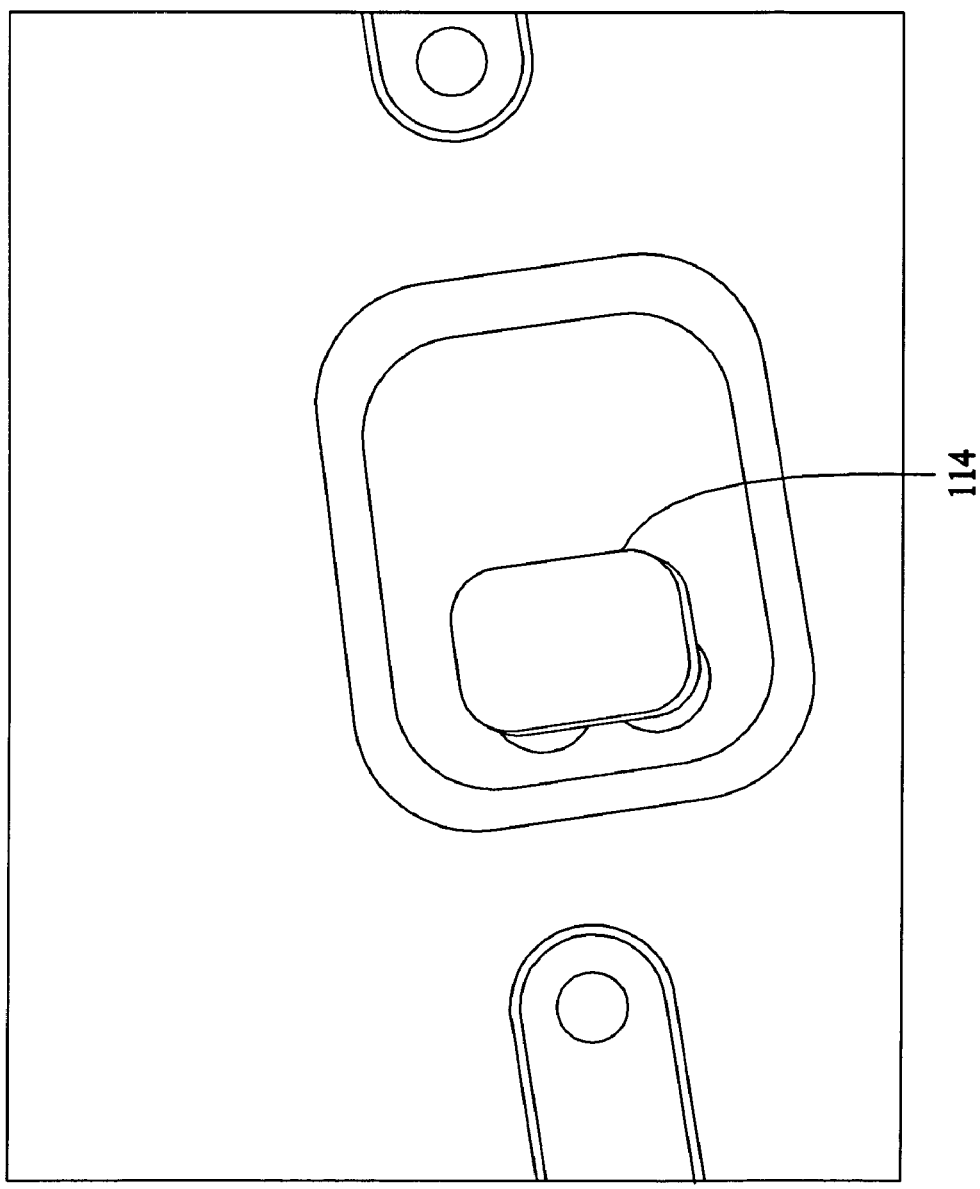
FIG. 30 is a perspective view of a locking portion of a connection system of a PV coil in accordance with an exemplary embodiment of the invention.
Figure 31:
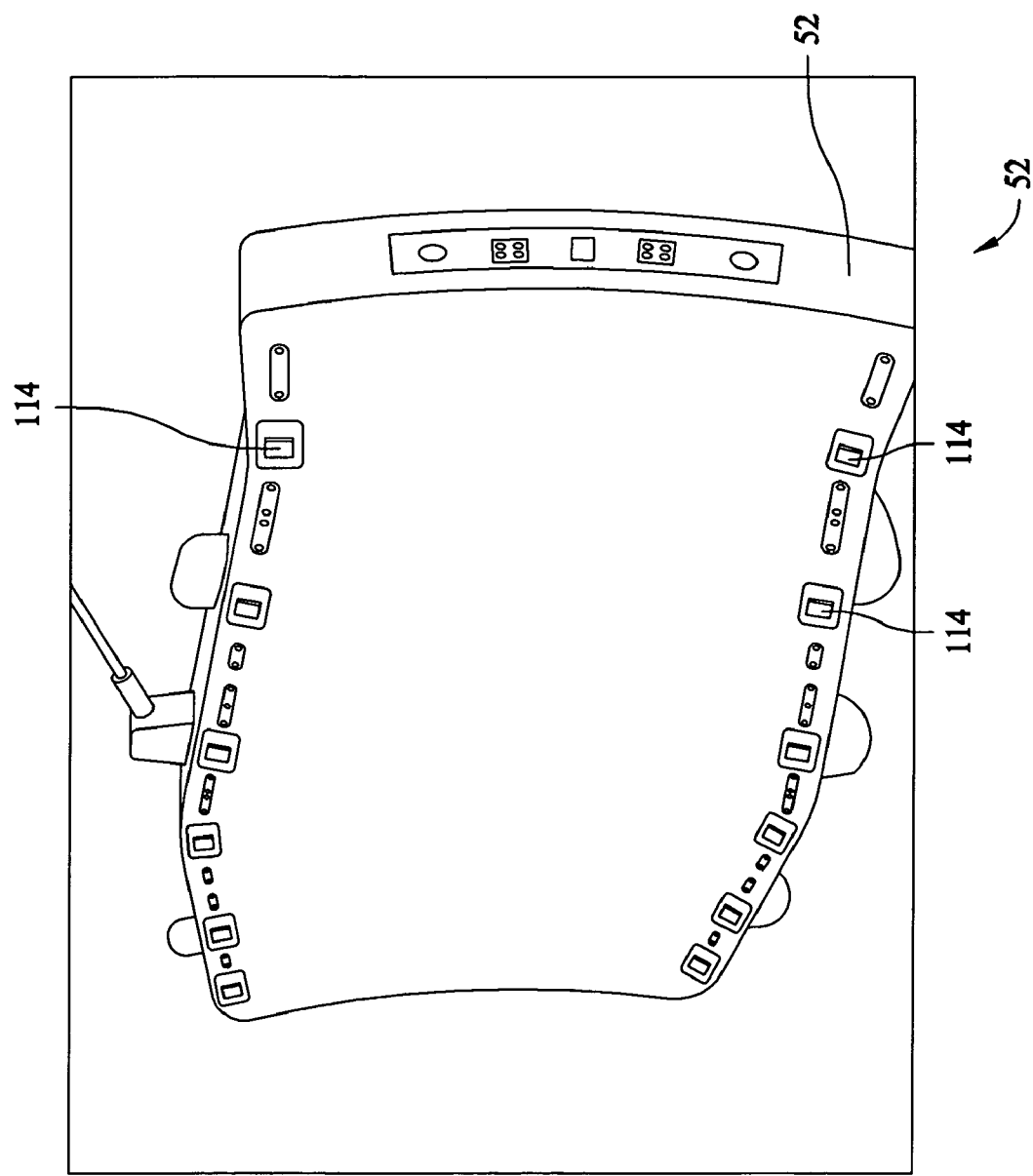
FIG. 31 is a perspective view of a base section of a PV coil in accordance with an exemplary embodiment of the invention.
Figure 32:
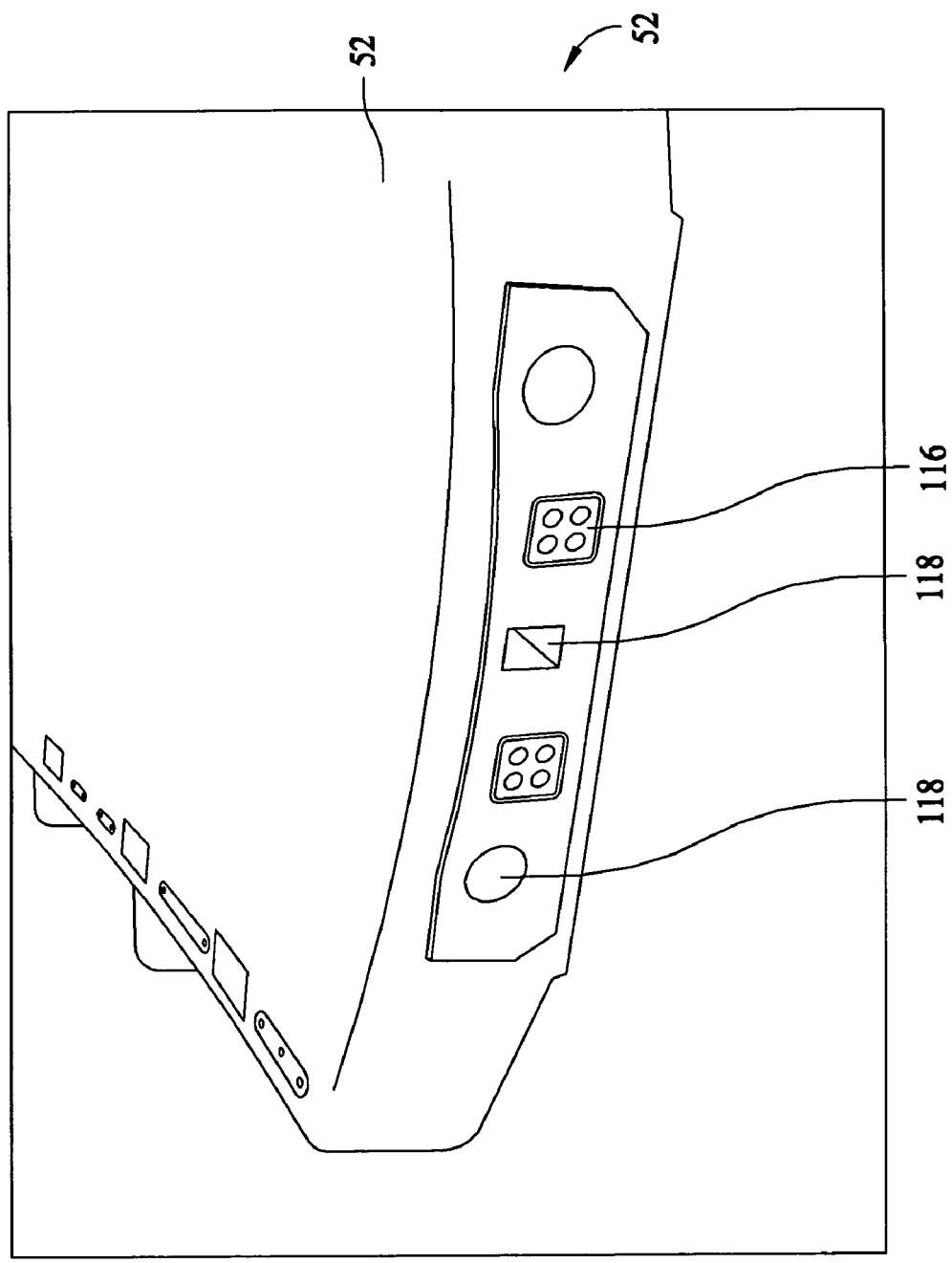
FIG. 32 is a perspective view of a side of a base section of a PV coil in accordance with an exemplary embodiment of the invention.
Figure 33:
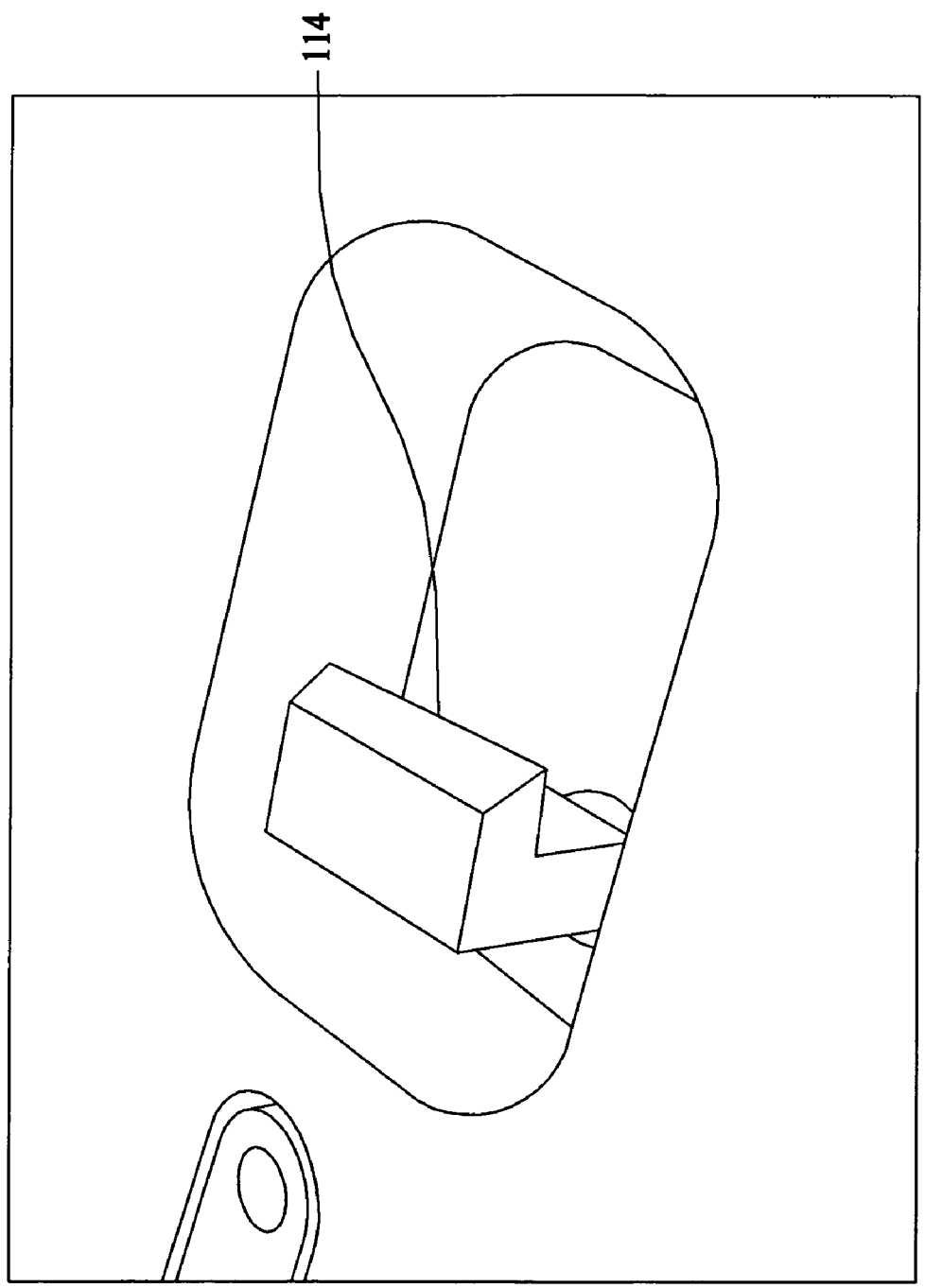
FIG. 33 is another perspective view of a locking portion of a connection system of a PV coil in accordance with an exemplary embodiment of the invention.

The main coil base 52, as shown in FIGS. 31 and 32, includes complimentary locking portions 114 (e.g., latch points) that are recessed and configured for connection to the latching portions 112 of the top sections 54, 56 and 58. The locking portion 114 is shown more clearly in FIGS. 30 and 33. Electrical connections 116 and receiving portions 118 are provided on a lower portion of the main coil base 52 and configured (e.g., sized and shaped) for connection to the foot coil section 60.

Figure 34:
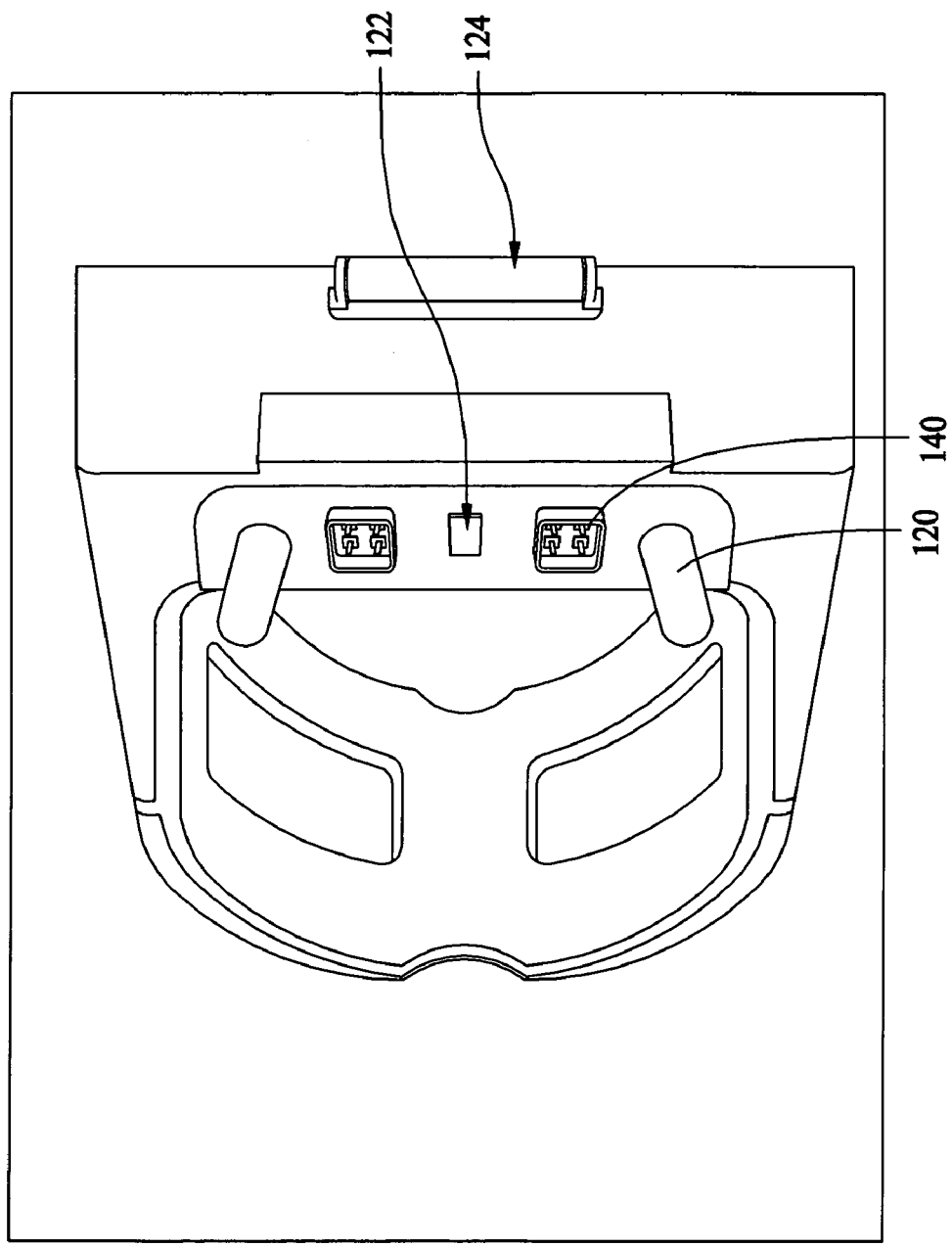
FIG. 34 is a perspective view of a foot section of a PV coil in accordance with an exemplary embodiment of the invention.
Figure 35:
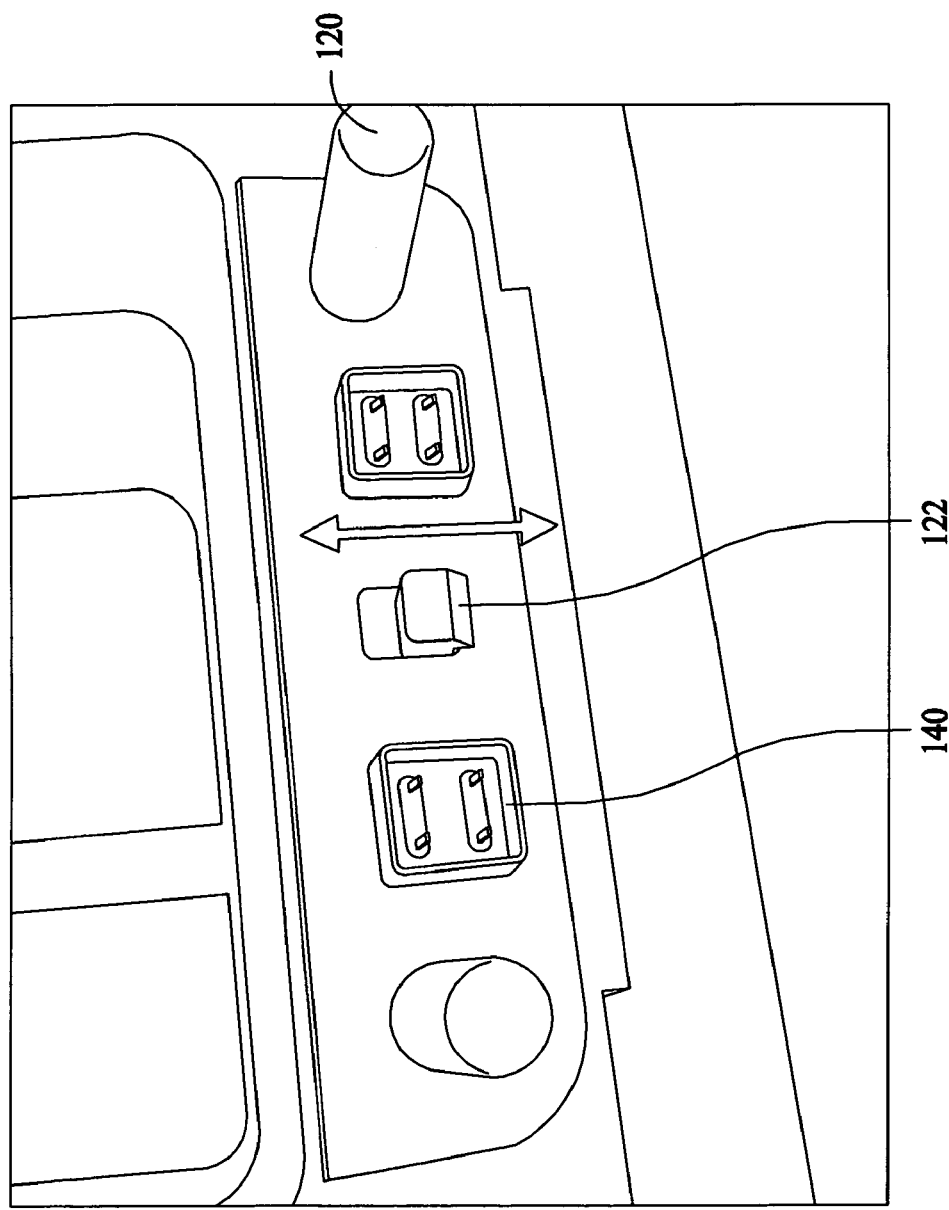
FIG. 35 is another perspective view a foot section of a PV coil in accordance with an exemplary embodiment of the invention showing connections thereof.
Figure 36:
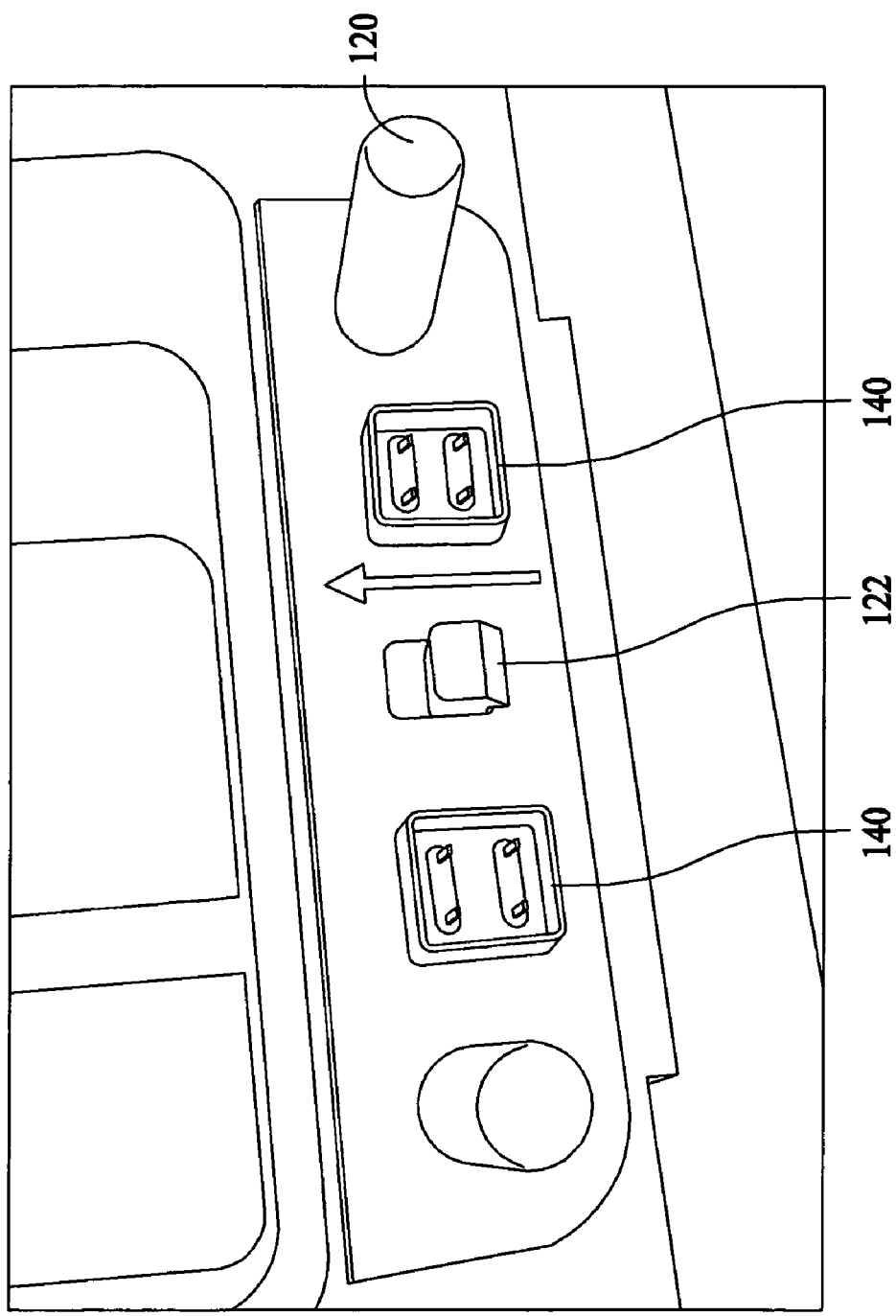
FIG. 36 is another partial perspective view a foot section of a PV coil in accordance with an exemplary embodiment of the invention showing connections thereof.

The foot coil section 60, as shown in FIGS. 34 through 36, includes rod members 120 that are received by the receiving portions 118 for mechanically guiding and connecting the foot coil section 60 to the main coil base 52. A middle receiving portion 118 of the main coil base 52 receives a spring loaded connector 122 of the foot coil section 60.

Electrical connections 140 (e.g., RF connectors) also are provided for electrically connecting the foot coil section 60 to the main coil base 52 via electrical connections 116.

Figure 37:
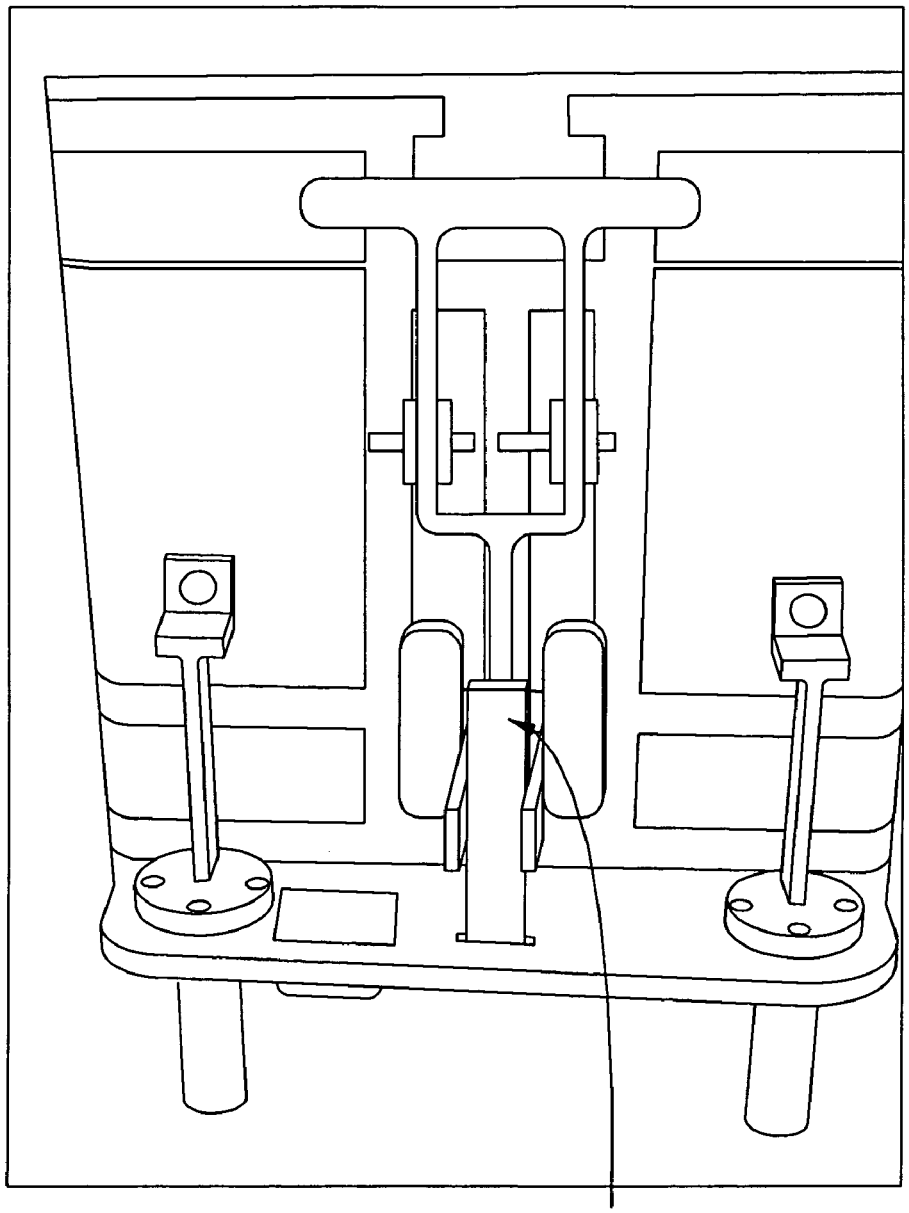
FIG. 37 is a perspective view of a bottom portion of a foot section of a PV coil in accordance with an exemplary embodiment of the invention.
Figure 38:
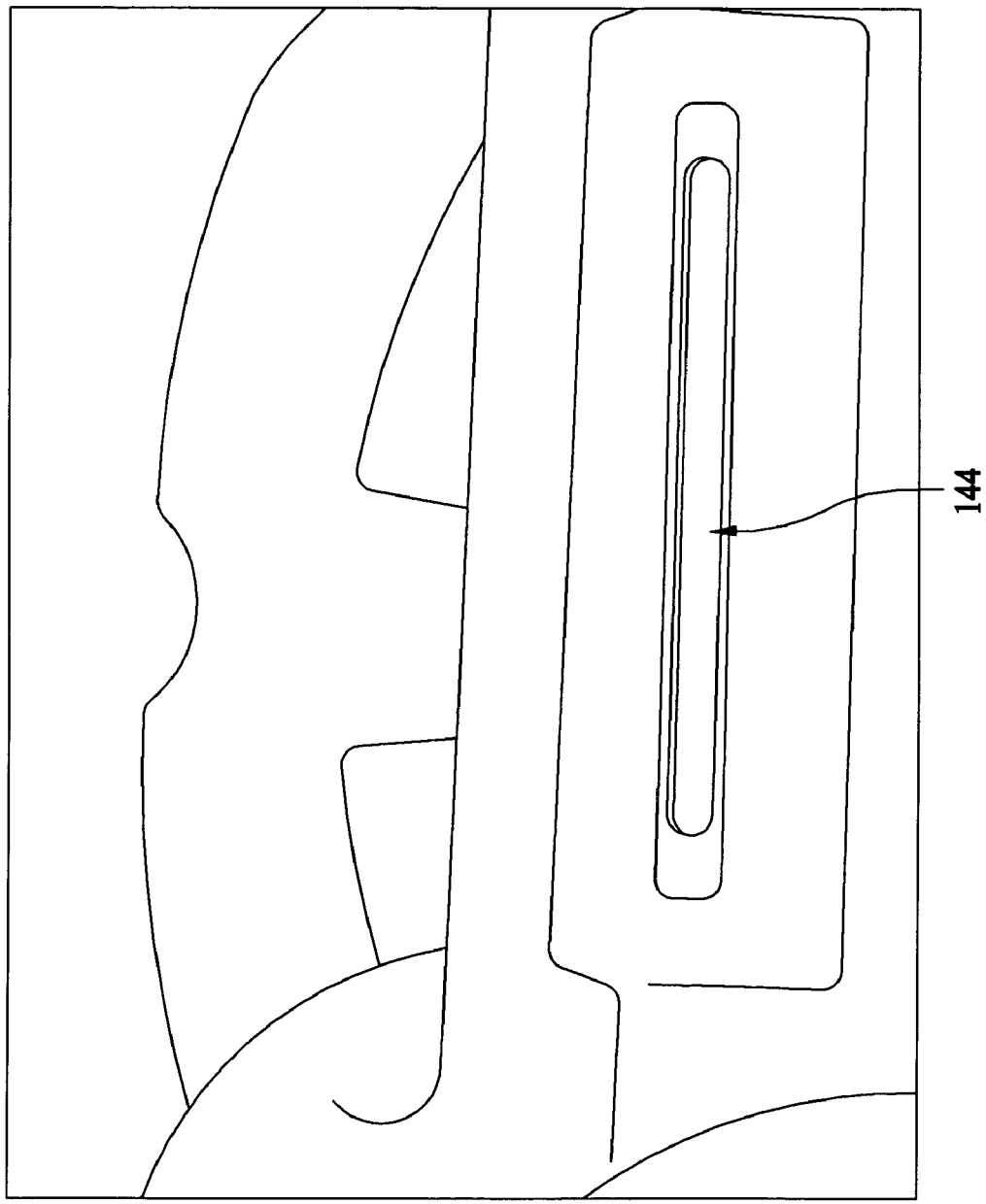
FIG. 38 is a perspective view of a lever of a foot section of a PV coil in accordance with an exemplary embodiment of the invention.
Figure 39:
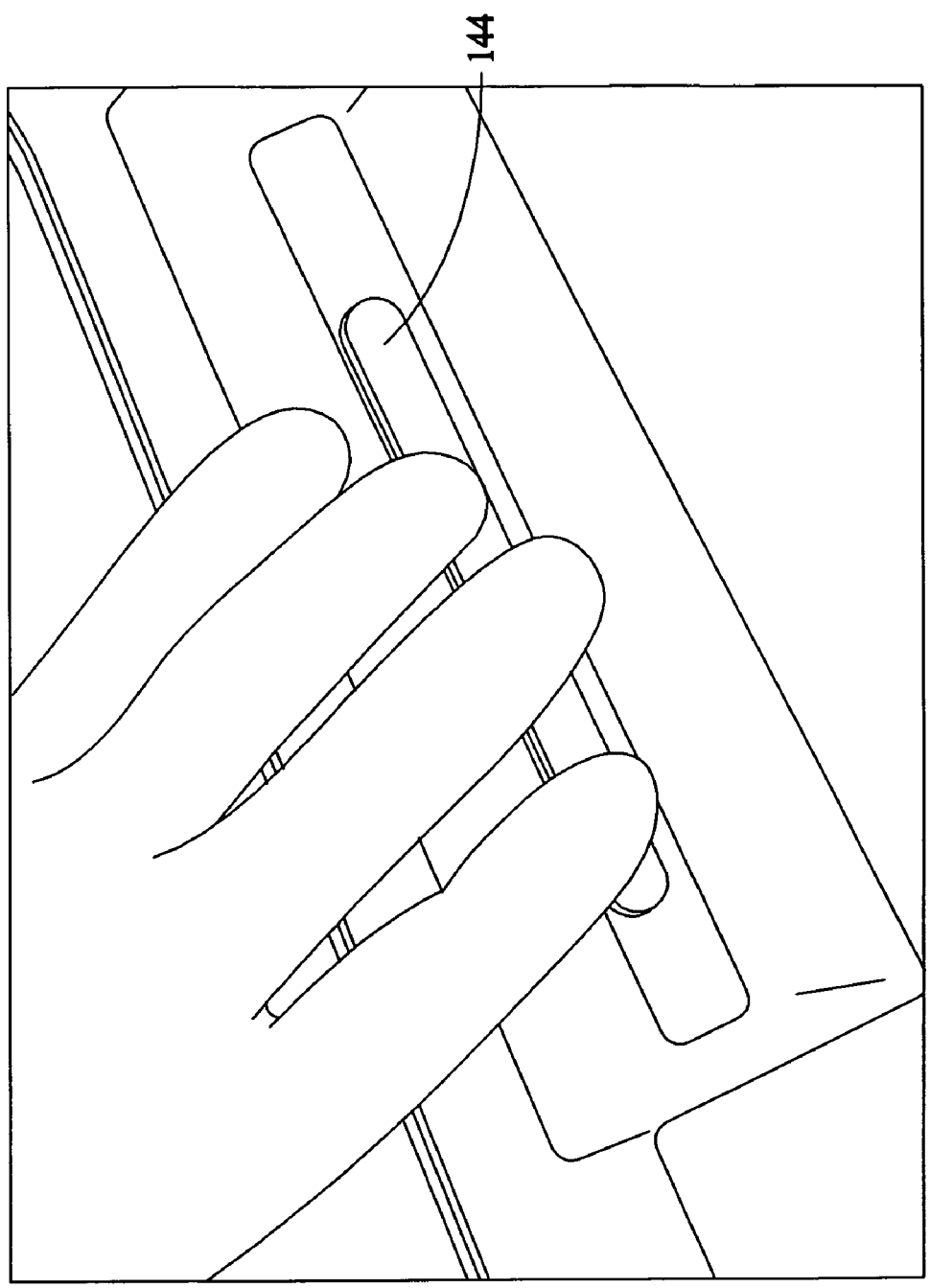
FIG. 39 is another perspective view of a lever of a foot section of a PV coil in accordance with an exemplary embodiment of the invention.

A mechanical roller 124 also may be provided to allow movement of the foot coil section 60 on a support surface (e.g., examination table). The foot coil section 60 also may include, for example, a foam pad therein for supporting a patient. The foot coil section 60 also includes a latching mechanism 142 as shown in FIG. 37 as part of the spring loaded connector 122 providing locking operation with the middle receiving portion 118. For example, as shown in FIGS. 38 and 39, a hand operated lever 144 may be provided for mechanically engaging and disengaging the foot coil section 60 to and from the main coil base 52 (e.g., moving the spring loaded connector up and down).

Figure 40:
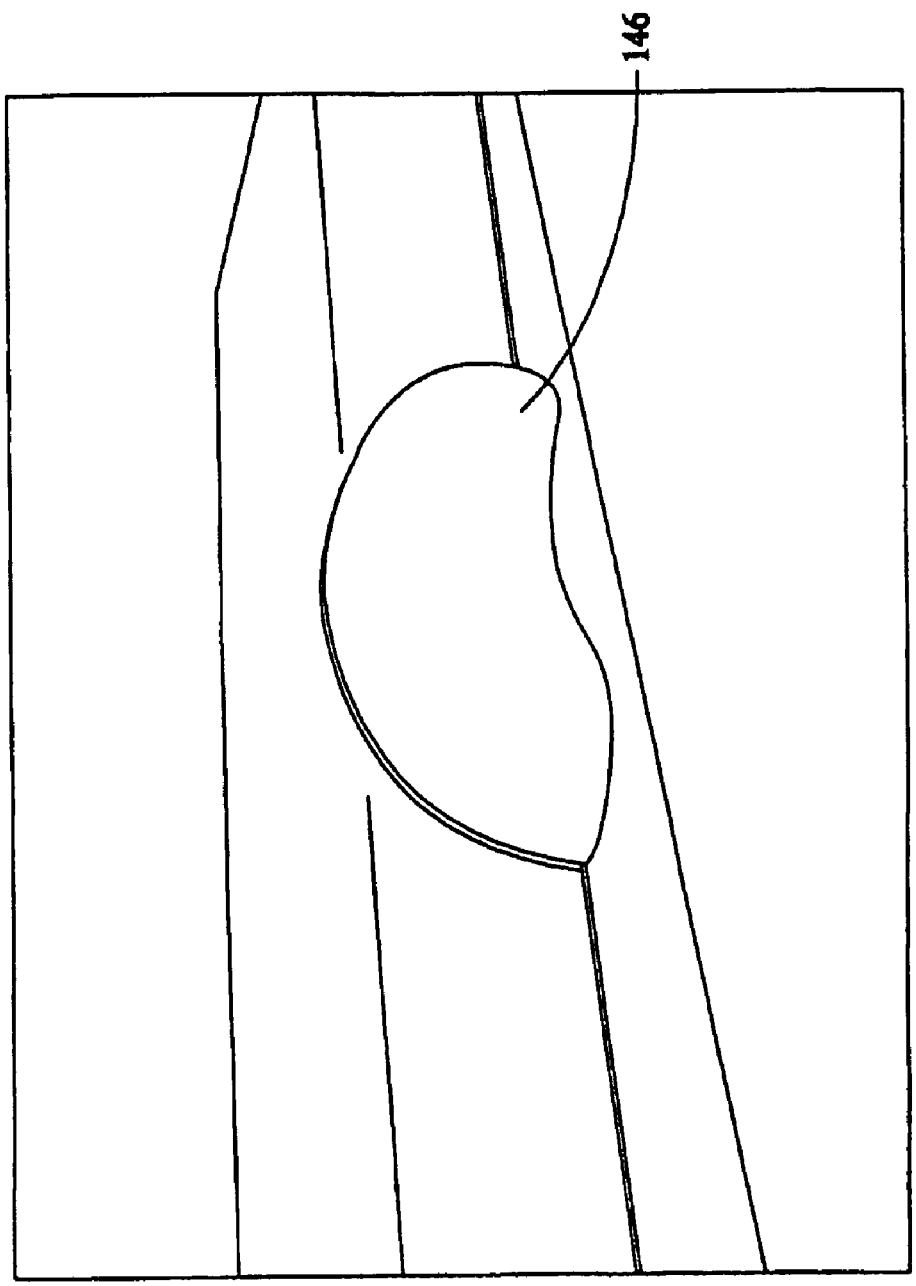
FIG. 40 is a perspective view of a handle of a base section of a PV coil in accordance with an exemplary embodiment of the invention.

The main coil base 52 also may include handles 146 as shown in FIG. 40 for moving the PV coil 50 (e.g., onto and off of an examination table).

In operation, the PV coil 50 may be used as a receiving system to produce images in an MRI system (not shown) using a dedicated system whole-body coil as the transmitter. The PV coil 50, configured as a receive only coil, does not generate magnetic or electrical field in the imaged volume. Thus, the PV coil 50 may be positioned inside a whole-body transmit coil, and correspondingly inside the excitation $B_1$ magnetic field of the whole-body coil. The PV coil 50 is switched off or deresonated when the whole-body coil is transmitting. Further, in one exemplary embodiment, eight RF chokes (not shown) are provided for each two-turn coil element 64, 72, 80 and 86, five RF chokes are provided for each saddle coil element 66, 68, 74, 76, 82, 84, 88 and 90 and twelve RF chokes are provided for each uneven counter rotational coil element 62, 70 and 78. These chokes may be arranged and configured as desired or needed (e.g., based on desired system operating characteristics). In operation, the RF chokes may be configured to be switched on and off actively or passively. For example, the passive decoupling chokes may include small-signal diodes that can be activated by the induced RF voltages across the diodes during transmission time. The active decoupling RF chokes may include PIN diodes that can be turned on and off by applied DC voltages across the PIN diodes during transmit and receive times.

In operation, an active blocking circuit (not shown) may be formed and switched on and off through DC bias on the PIN diodes. During the transmission period the PIN diodes are turned on as shorted circuits with a forward bias DC source provided by the MRI system. The small-signal diodes in a passive blocking circuit are turned on by the induced RF voltage in the chokes coupled from the transmit field. Each small-signal diode is turned on when the induced RF voltage reaches about 0.5 volts. When either the PIN diodes or small-signal diodes are turned on, the corresponding blocking circuit becomes high in impedance (e.g., above two kilo-Ohm). The high impedance elements segregate the PV coil 50 into several isolated electrical segments. Thus, the deresonated PV coil 50 prevents RF current flow that might be induced by the transmission coil. If one of the diodes fails, the small-signal diodes will form a short circuit and permanently deresonate the PV coil 50 (e.g., until the diode is replaced or fixed).

The PV coil 50 may be provided with switching power via, for example, center conductors of an RF cable, such as standard RG coaxial type cables. The center conductor is an inner conductor surrounded by an insulating dielectric material, an outer shield connected to a ground circuit, an outer insulating material and a cable assembly insulating jacket.

The supply voltage also may be provided in the circuitry of the PV coil 50, which is enclosed within the housing 100 (shown in FIG. 1).

Figure 41:
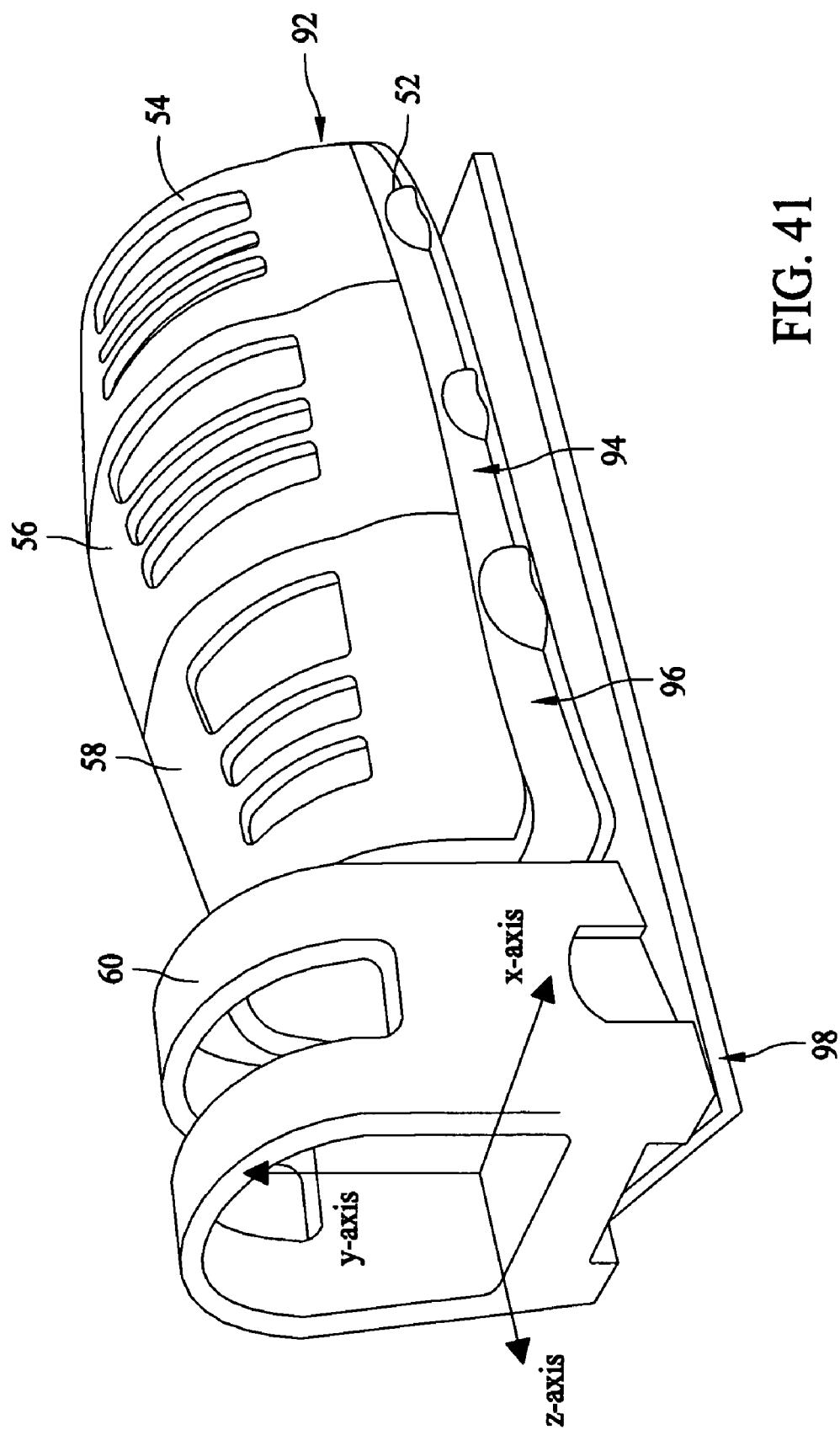
FIG. 41 is another perspective view of a PV coil in accordance with an exemplary embodiment of the invention.
Figure 42:
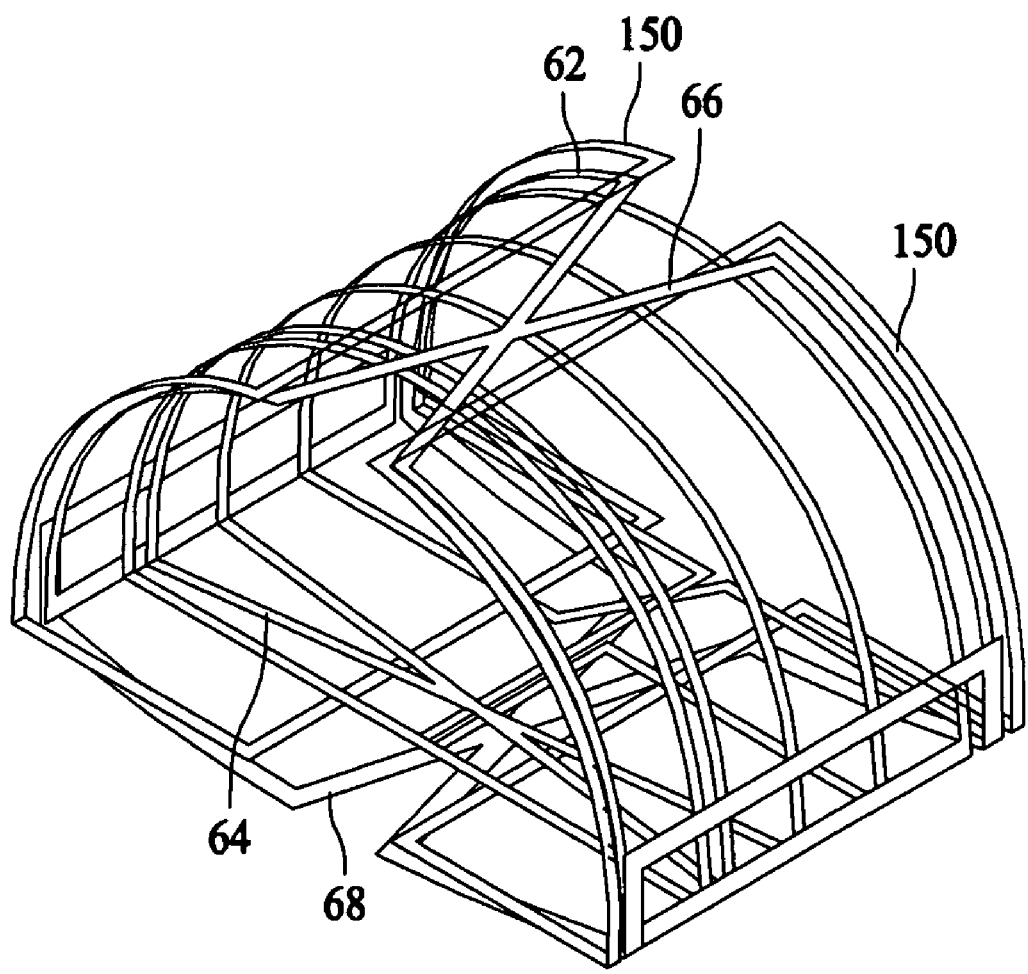
FIG. 42 is a perspective view of one station of the PV coil of FIG. 1 having additional coil elements.
Figure 43:
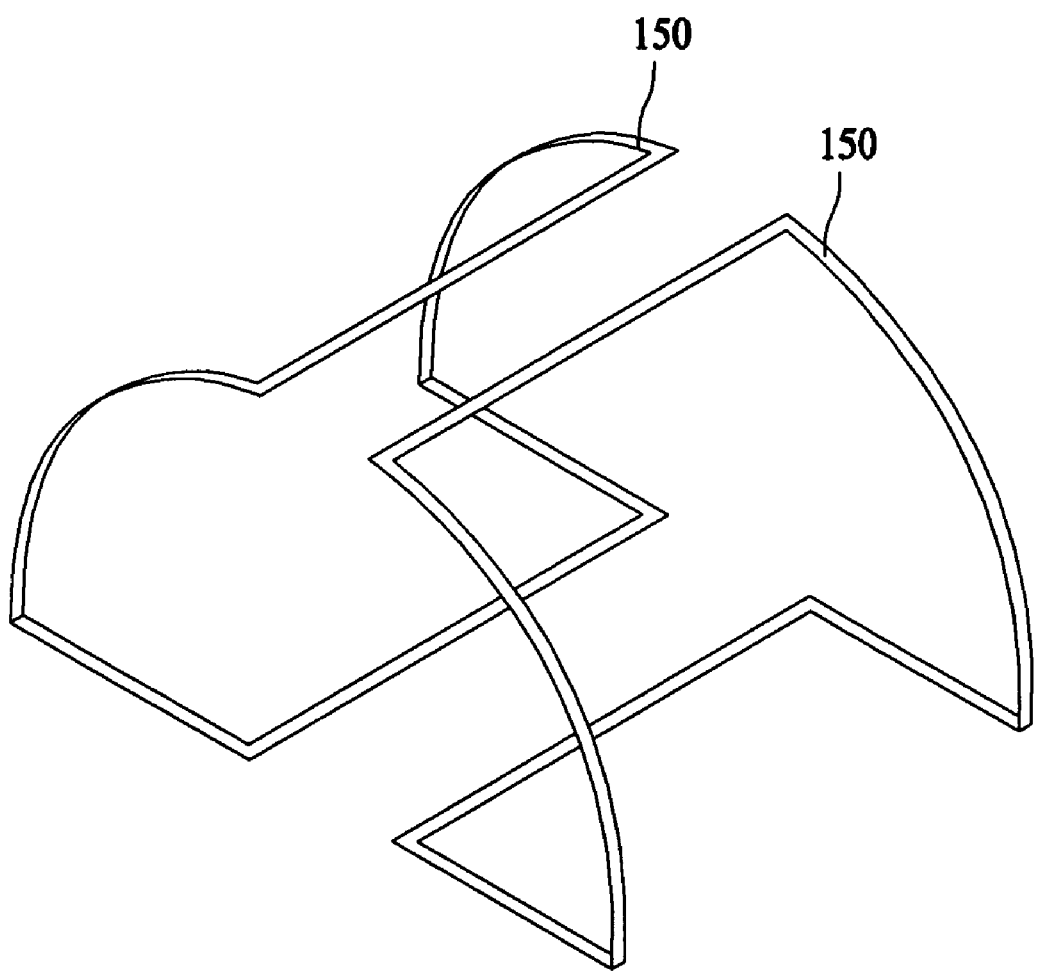
FIG. 43 is a perspective view of the additional coil elements of FIG. 42.

Thus, as shown in FIG. 41, various embodiments of the invention provide a multi-station, for example, four station PV coil 50 having removably connectable or attachable sections. The top or anterior sections are removably connectable to the base section. It should be noted that the PV coil may be modified, for example, by providing additional coils to the coil sections. For example, as shown in FIG. 42, station 92 may include two additional loop coils 150 to provide left-right SENSE acceleration (relative to the left and right of a patient). The two additional loop coils 150 are shown separately in FIG. 43. Similar additional loop coils also may be provided to stations 94 and 96 to allow for left-right sense acceleration.

The positioning of the coils provides for expanded image coverage and an expanded field of view (FOV) (e.g., greater than 135 cm). Further, the detachable foot section provides a large combined FOV. PV imaging as well as general body imaging may be provided with the PV coil 50.

The PV coil 50 allows clinical imaging of the peripheral vasculature on MRI open systems and allows imaging of larger patient sizes on the horizontal MRI systems (e.g., by removing one of more of the detachable sections).

The stations may be switched using PIN diode technology, and can be decoupled using passive, active diode switching or auto bias technology. SENSE compatibility is provided in two directions, and can be provided in 3D (including left-right direction) by adding two additional loop coils located in the x-direction as described herein.

While the invention has been described in terms of various specific embodiments, those skilled in the art will recognize that the invention can be practiced with modification within the spirit and scope of the claims.

What is claimed is:

1. A peripheral vascular coil comprising:
   a single planar base coil section having a plurality of coil elements; and
   a plurality of coil sections each configured for removable attachment to a top portion of the base coil section independent of the other coil sections, each of the plurality of coil sections having a plurality of coil elements and the plurality of coil sections extending parallel to the base coil section and together defining a cavity extending along a longitudinal axis.

2. A peripheral vascular coil in accordance with claim 1 wherein the coil sections are configured to provide peripheral vascular imaging in an open magnetic resonance imaging system.

3. A peripheral vascular coil in accordance with claim 1 wherein the base coil section and plurality of coil sections together form a plurality of stations.

4. A peripheral vascular coil in accordance with claim 3 wherein each of the stations comprise two saddle coil elements.

5. A peripheral vascular coil in accordance with claim 4 wherein three of the plurality of stations comprise two solenoid coil elements.

6. A peripheral vascular coil in accordance with claim 5 wherein one of the solenoid coil elements is an uneven counter rotational coil element.

7. A peripheral vascular coil in accordance with claim 5 wherein one of the solenoid coil elements is a two turn solenoid coil element.

8. A peripheral vascular coil in accordance with claim 5 wherein one of the plurality of stations comprises one solenoid coil element.

9. A peripheral vascular coil in accordance with claim 3 wherein the plurality of stations comprise four stations, one configured for imaging a torso region of a patient, one for imaging a pelvic region of the patient, one for imaging upper legs of the patient and one for imaging lower legs and feet of the patient.

10. A peripheral vascular coil in accordance with claim 1 wherein the plurality of coil sections comprise a plurality of top coil sections and a foot coil section.

11. A peripheral vascular coil in accordance with claim 1 wherein the coil sections are configured to SENSE imaging in two different directions.

12. A peripheral vascular coil in accordance with claim 1 further comprising a connection system for removably connecting the plurality of coil sections to the base coil section and configured to provide single finger operation.

13. A peripheral vascular coil comprising:
   a plurality of differently sized imaging stations formed by (i) a single posterior base section, (ii) a plurality of anterior sections and (iii) a foot section, each of the plurality of anterior sections and the foot section configured to be removably attached to the posterior base section to define a planar imaging area; and
   a plurality of coil elements forming the sections and comprising at least one of uneven counter rotational coil elements, co-rotating two-turn solenoid coil elements and saddle coil elements.

14. A peripheral vascular coil in accordance with claim 13 wherein each of the stations comprise at least one anterior saddle coil and one posterior saddle coil.

15. A peripheral vascular coil in accordance with claim 13 wherein at least three of the plurality of imaging stations comprise coil elements configured in an uneven counter-rotational array.

16. A peripheral vascular coil in accordance with claim 13 wherein at least one of the plurality of imaging stations comprises a single solenoid coil arrangement.

17. A peripheral vascular coil in accordance with claim 13 further comprising a connection system for removably attaching the sections and configured to provide one finger operation.

18. A method for performing peripheral vascular imaging using an open magnetic resonance imaging system, said method comprising:
   configuring a plurality of imaging stations such that three of the plurality of imaging stations include two saddle coil elements and two solenoid coil elements and one of the plurality of imaging stations includes two saddle coil elements and one solenoid coil element; and
   providing a connection system for removably attaching coil sections to form the plurality of imaging stations together forming a cavity extending along a single axis.

19. A method in accordance with claim 18 further comprising configuring the plurality of imaging stations to provide SENSE imaging in two directions.

20. A method in accordance with claim 18 wherein the imaging stations comprise at least one base section, one foot section and a plurality of top sections.

* * * * *